United States Patent
Ohnuma et al.

(10) Patent No.: US 7,955,949 B2
(45) Date of Patent: Jun. 7, 2011

(54) MANUFACTURING METHOD OF SOI SUBSTRATE

(75) Inventors: Hideto Ohnuma, Atsugi (JP); Yoichi Iikubo, Isehara (JP); Takayoshi Sato, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/829,409

(22) Filed: Jul. 2, 2010

(65) Prior Publication Data

US 2010/0270639 A1 Oct. 28, 2010

Related U.S. Application Data

(63) Continuation of application No. 12/078,091, filed on Mar. 27, 2008, now Pat. No. 7,767,542.

(30) Foreign Application Priority Data

Apr. 20, 2007 (JP) ................................. 2007-112432

(51) Int. Cl.
 *H01L 21/30* (2006.01)
 *H01L 21/46* (2006.01)
(52) U.S. Cl. ............ 438/455; 438/29; 438/458; 257/66; 257/67
(58) Field of Classification Search .................... 438/29, 438/455, 458, 480; 257/66, 67, E21.001, 257/E21.221
See application file for complete search history.

(56) References Cited

U.S. PATENT DOCUMENTS

| 6,372,609 | B1 | 4/2002 | Aga et al. | |
|---|---|---|---|---|
| 6,613,678 | B1 * | 9/2003 | Sakaguchi et al. | 438/695 |
| 7,119,365 | B2 | 10/2006 | Takafuji et al. | |
| 7,341,923 | B2 | 3/2008 | Yonehara | |
| 7,508,034 | B2 | 3/2009 | Takafuji et al. | |
| 2008/0268263 | A1 * | 10/2008 | Yamazaki | 428/446 |

FOREIGN PATENT DOCUMENTS

| JP | 2004-087606 | 3/2004 |
|---|---|---|
| JP | 2004-134675 | 4/2004 |
| JP | 2005-252244 | 9/2005 |

* cited by examiner

*Primary Examiner* — Phuc T Dang
(74) *Attorney, Agent, or Firm* — Eric J. Robinson; Robinson Intellectual Property Law Office, P.C.

(57) ABSTRACT

There is provided a method of manufacturing an SOI substrate which is practicable even when a supporting substrate having a low allowable temperature limit is used. A separation layer is formed in a region at a certain depth from a surface of a semiconductor substrate, and a first heat treatment is conducted when a semiconductor layer on the separation layer is bonded to the supporting substrate and separated. A second heat treatment is conducted to the supporting substrate to which the semiconductor layer is bonded. The second heat treatment is conducted at a temperature which is equal to or higher than the temperature of the first heat treatment and does not exceed a strain point of the supporting substrate. When the first heat treatment and the second heat treatment are conducted at the same temperature, a treatment time of the second heat treatment may be set to be longer.

26 Claims, 24 Drawing Sheets

FIG.24

| Acceleration voltage | The ratio of the amount of H (X:Y) | The ratio of the number of H⁺ ions (X:Y/3) |
|---|---|---|
| 80keV | 1:44.1 | 1:14.7 |
| 60keV | 1:42.5 | 1:14.2 |
| 40keV | 1:43.5 | 1:14.5 |

MANUFACTURING METHOD OF SOI SUBSTRATE

BACKGROUND OF THE INVENTION

1. Field of the Invention

The present invention relates to a substrate having an SOI structure, which is formed by bonding a semiconductor layer formed from a thin slice of a crystalline semiconductor substrate to a different kind of substrate. In particular, the present invention relates to a bonding SOI technique, and also relates to a manufacturing method of an SOI substrate in which a single-crystalline or polycrystalline semiconductor layer is bonded to a substrate having an insulating surface such as a glass substrate. Further, the present invention relates to a display device or a semiconductor device using such a substrate having an SOI structure.

2. Description of the Related Art

A semiconductor substrate called a silicon-on-insulator (SOI substrate) that has a thin single-crystalline semiconductor layer on an insulating layer has been developed instead of a silicon wafer that is manufactured by thinly slicing an ingot of a single-crystalline semiconductor, and the SOI substrate is spreading as a substrate in manufacturing a microprocessor or the like. This is because an integrated circuit using an SOI substrate draws attention as an integrated circuit in which parasitic capacitance between drains of transistors and a substrate can be reduced, performance of the semiconductor integrated circuit can be improved, and low power consumption is achieved.

As a method for manufacturing SOI substrates, a hydrogen ion implantation separation method is known (for example, see Patent Document 1: U.S. Pat. No. 6,372,609). The hydrogen ion implantation separation method is a method in which hydrogen ions are implanted into a silicon wafer to form a microbubble layer at a predetermined depth from the surface, and a thin silicon layer (SOI layer) is bonded to another silicon wafer using the microbubble layer as a cleavage plane. In addition to the heat treatment for separation of an SOI layer, it is necessary to perform heat treatment in an oxidizing atmosphere to form an oxide film on the SOI layer, remove the oxide film, and perform heat treatment at 1000° C. to 1300° C. in a reducing atmosphere to increase bonding strength.

On the other hand, forming an SOI layer on an insulating substrate such as glass is also attempted. As an example of SOI substrates in which SOI layers are formed on glass substrates, an SOI substrate in which a thin single-crystalline silicon layer is formed over a glass substrate having a coating film by a hydrogen ion implantation separation method is known (see Patent Document 2: U.S. Pat. No. 7,119,365). In this case also, the thin silicon layer (SOI layer) is formed over the glass substrate in such a way that a microbubble layer is formed at a predetermined depth from the surface by implantation of hydrogen ions to a single-crystalline silicon wafer, the glass substrate and the single-crystalline silicon wafer are bonded, and the silicon wafer is separated using the microbubble layer as a cleavage plane.

SUMMARY OF THE INVENTION

In order to separate a single-crystalline silicon layer from a silicon wafer by a hydrogen ion implantation separation method, heat treatment at a high temperature equal to or higher than 600° C. has been required. However, in the case of forming an SOI substrate by bonding single-crystalline silicon to a glass substrate that is used in a liquid crystal panel or the like for cost reduction of the substrate, there has been a problem in that such heat treatment at a high temperature causes warping of the glass substrate. When the glass substrate warps, reduction in bonding strength to the single-crystalline silicon layer is a concern. In addition, there is also a problem in that strain stress is applied to the single-crystalline silicon layer and characteristics of the transistor are adversely affected. In other words, with a conventional technique, even when a single-crystalline silicon layer is provided over a glass substrate and a transistor is manufactured using the single-crystalline silicon layer, adequate characteristics cannot be obtained.

In consideration of such problems, it is an object to provide an SOI substrate including a crystalline semiconductor layer which is practicable even when a substrate having a low allowable temperature limit such as a glass substrate is used. Further, it is another object to provide a semiconductor device using such an SOI substrate.

The gist of the invention is to bond a single-crystalline semiconductor to a supporting substrate having an insulating surface at a temperature equal to or lower than a strain point of the supporting substrate. This single-crystalline semiconductor layer is formed through a plurality of heat treatment steps.

A separation layer is formed in a region at a certain depth from a surface of a single-crystalline or polycrystalline semiconductor substrate, and first heat treatment is conducted when a semiconductor layer on the separation layer is bonded to a supporting substrate and separated. Then, second heat treatment is conducted to the supporting substrate to which the semiconductor layer is bonded. The first heat treatment and the second heat treatment are preferably conducted at different temperatures. In this case, the second heat treatment is preferably conducted at a temperature which is higher than the temperature of the first heat treatment and does not exceed a strain point of the substrate to which the semiconductor layer is bonded. Alternatively, when the first heat treatment and the second heat treatment are conducted at the same temperature, the treatment time of the second heat treatment may be set to be longer than that of the first heat treatment.

The separation layer provided at a predetermined depth from the surface of the single-crystalline or polycrystalline semiconductor substrate is formed by introducing accelerated ions from the surface of the semiconductor substrate. The ions introduced preferably include ions of one kind or ions of plural kinds of the same type of atom which have different masses. For example, a predetermined gas is made into plasma to generate a plurality of ion species, and without mass separation, the ion species are accelerated by electric field and introduced to a single-crystalline or polycrystalline semiconductor substrate. Typically, hydrogen ions are selected, and $H^+$, $H_2^+$, and $H_3^+$ ions are employed as the ions of plural kinds of the same type of atom which have different masses. In this case, the proportion of $H_3^+$ ions is preferably made higher than those of the other ion species.

In fixing a semiconductor layer which is thinly separated from a single-crystalline or polycrystalline semiconductor substrate to a supporting substrate, a layer which has a smooth surface and forms a hydrophilic surface is provided for one or both of surfaces which form a bond, as a bonding surface. As such a layer, a silicon oxide layer is typically employed. This silicon oxide film is preferably formed by thermal oxidation, chemical reaction, or chemical vapor deposition.

In bonding a crystalline semiconductor layer which is separated from a single-crystalline or polycrystalline semiconductor substrate to a supporting substrate, a substrate having an SOI structure superior in crystallinity can be obtained by conducting plural heat treatments. Even when the supporting substrate and the crystalline semiconductor layer, which are bonded to each other, have different thermal characteristics such as strain points and coefficients of thermal expansion, an SOI substrate superior in crystallinity with relaxed distortion can be obtained by conducting heat treatment by which a bond is formed and later heat treatment at different temperatures and/or different treatment times.

BRIEF DESCRIPTION OF THE DRAWINGS

In the accompanying drawings:

FIG. 24 is a list of ratios of fitting parameters (hydrogen atom ratios and hydrogen ion species ratios).

DETAILED DESCRIPTION OF THE INVENTION

Figure 1A:
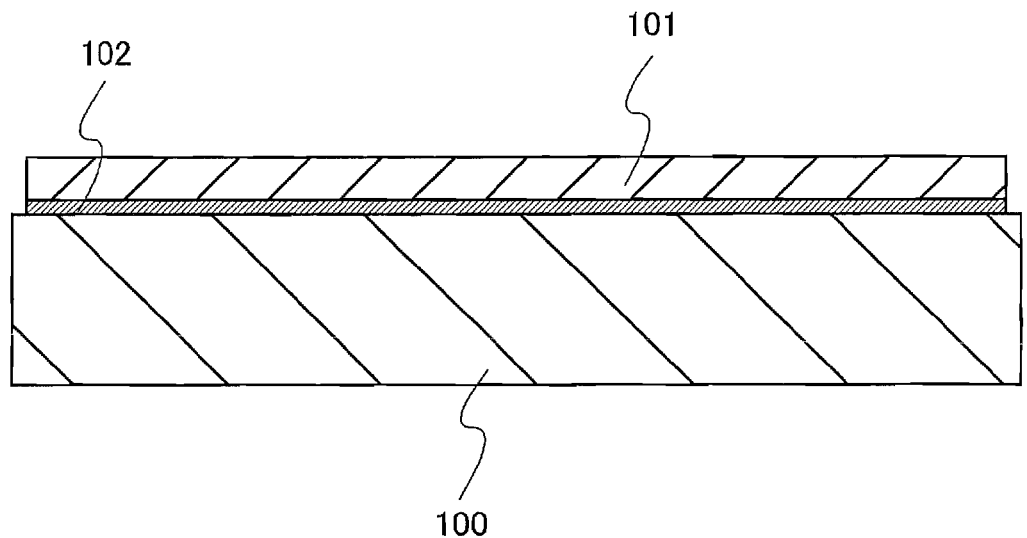
FIGS. 1A and 1B are cross-sectional views of structures of a substrate having an SOI structure.

Embodiment mode of the present invention will be described with reference to the drawings. It is easily understood by those skilled in the art that various changes may be made in forms and details without departing from the spirit and the scope of the invention. Therefore, the present invention should not be interpreted as being limited to the description of the embodiment mode below. In structures of the present invention described below, the same reference numerals are commonly given to the same components or components having similar functions throughout the drawings.

Figure 1B:
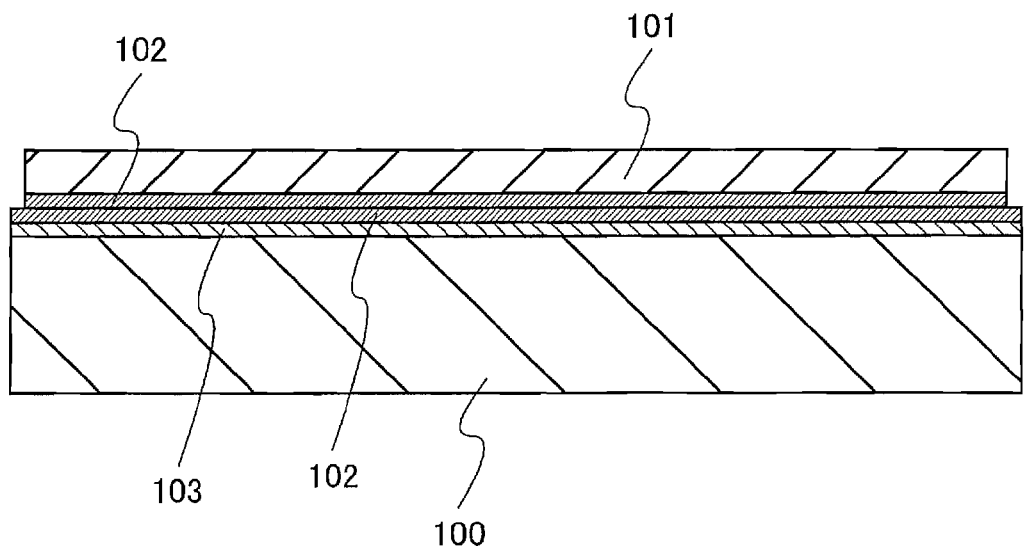

FIGS. 1A and 1B show substrates each having an SOI structure according to this embodiment mode. In FIG. 1A, a supporting substrate 100 has an insulating property or an insulating surface, and glass substrates used for electronics industry (also called a "non-alkali glass substrate") such as an aluminosilicate glass substrate, an aluminoborosilicate glass substrate, or a barium borosilicate glass substrate can be used. In other words, a glass substrate having a coefficient of thermal expansion of from $25 \times 10^{-7}/°C$. to $50 \times 10^{-7}/°C$. (preferably, from $30 \times 10^{-7}/°C$. to $40 \times 10^{-7}/°C$.) and a strain point of from 580° C. to 680° C. (preferably, from 600° C. to 680° C.) can be used. Alternatively, a quartz substrate, a ceramic substrate, a metal substrate having a surface coated with an insulating film, or the like can be used.

Single-crystalline silicon is typically used for a single-crystalline semiconductor layer 101. Alternatively, silicon or germanium which can be separated from a single-crystalline semiconductor substrate or a polycrystalline semiconductor substrate by a hydrogen ion implantation separation method can be used, or a single-crystalline semiconductor or a polycrystalline semiconductor of a compound semiconductor such as gallium arsenide or indium phosphide can be used.

Between the supporting substrate 100 and the single-crystalline semiconductor layer 101, a bonding layer 102 which has a smooth surface and forms a hydrophilic surface is provided. This bonding layer 102 is a layer which has a smooth surface and has a hydrophilic surface. As a layer which can form such a surface, an insulating layer formed by chemical reaction is preferable. For example, an oxide film which is formed by thermal reaction or chemical reaction is appropriate for the bonding layer 102. This is mainly because the smoothness of the surface can be secured when using a film formed by chemical reaction. The bonding layer 102 which has a smooth surface and forms a hydrophilic surface is provided with a thickness of from 0.2 nm to 500 nm. With this thickness, it is possible to smooth surface roughness of a surface on which a film is to be formed and also to ensure smoothness of a surface of the film.

When the single-crystalline semiconductor layer 101 is formed using silicon, silicon oxide formed by heat treatment in an oxidizing atmosphere, silicon oxide which grows due to reaction of oxygen radicals, a chemical oxide formed using an oxidizing chemical solution, or the like can be formed as the bonding layer 102. In the case of using a chemical oxide as the bonding layer 102, the thickness of the chemical oxide may be from 0.2 nm to 1 nm. Preferably, silicon oxide deposited by chemical vapor deposition can be used as the bonding layer 102. In this case, a silicon oxide film formed by chemical vapor deposition using an organic silane gas is preferable. As the organic silane gas, a silicon-containing compound such as tetraethoxysilane (TEOS: chemical formula, $Si(OC_2H_5)_4$), tetramethylsilane (TMS: chemical formula, $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

The bonding layer 102 is provided on the single-crystalline semiconductor layer 101 side and is made in close contact with a surface of the supporting substrate 100. In this way, bonding can be performed even at a room temperature. To form a stronger bond, the supporting substrate 100 and the single-crystalline semiconductor layer 101 may be pressed. For bonding between the supporting substrate 100 and the bonding layer 102 which are formed using different materials, surfaces thereof are cleaned. When the cleaned surfaces of the supporting substrate 100 and the bonding layer 102 are made in close contact with each other, a bond is formed by attractive force between the surfaces. Further, a more preferred mode can be obtained by adding treatment in which many hydrophilic groups are attached to the surface. For example, it is preferable that the surface of the supporting substrate 100 be subjected to oxygen plasma treatment or ozone treatment to have a hydrophilic property. In the case of adding the treatment by which the surface is made to have a hydrophilic property in this manner, hydroxyl groups on the surface act to form a bond due to hydrogen bonding. Further, the bond between the cleaned surfaces, which is formed by making the surfaces closely contact with each other, can be strengthened by being heated at a temperature equal to or higher than a room temperature.

As the treatment for bonding the supporting substrate 100 and the bonding layer 102 which are formed using different materials, the surfaces which form a bond may be irradiated with an ion beam using an inert gas such as argon so as to be cleaned. By the ion beam irradiation, dangling bonds are exposed on the surfaces of the supporting substrate 100 and the bonding layer 102, and the surfaces become very active. In this way, when activated surfaces are made in close contact with each other, a bond can be formed even at a low temperature. In the method of forming a bond by activating surfaces, since it is required to keep the surfaces in a highly clean state, the method is preferably carried out in vacuum.

The single-crystalline semiconductor layer 101 is formed from a thin slice of a crystalline semiconductor substrate. For example, the single-crystalline semiconductor layer 101 can be formed in such a manner that hydrogen ions or fluorine ions are introduced to a predetermined depth of a single-crystalline semiconductor substrate, heat treatment is then conducted, and the single-crystalline silicon layer, which is a surface layer, is separated. Alternatively, a method in which single-crystalline silicon is epitaxially grown on porous silicon and the porous silicon layer is cleaved by water jetting so as to be separated, may also be applied. The thickness of the single-crystalline semiconductor layer 101 is from 5 nm to 500 nm, and preferably from 10 nm to 200 nm.

FIG. 1B shows a structure in which a barrier layer 103 and the bonding layer 102 are provided for the supporting substrate 100. By provision of the barrier layer 103, the single-crystalline semiconductor layer 101 can be prevented from being contaminated by diffusion of a movable ion impurity such as an alkali metal or an alkaline earth metal from the glass substrate used as the supporting substrate 100. The bonding layer 102 is preferably provided over the barrier layer 103. By providing the plurality of layers having different functions, which are the barrier layer 103 for preventing diffusion of impurities and the bonding layer 102 for securing the bonding strength, over the supporting substrate 100, the supporting substrate can be selected from a wider range. The bonding layer 102 is preferably provided on the single-crystalline semiconductor layer 101 side as well. In other words, in bonding the single-crystalline semiconductor layer 101 to the supporting substrate 100, the bonding layer 102 is preferably provided for one or both of the surfaces which form a bond; accordingly, bonding strength can be heightened.

Figure 2A:
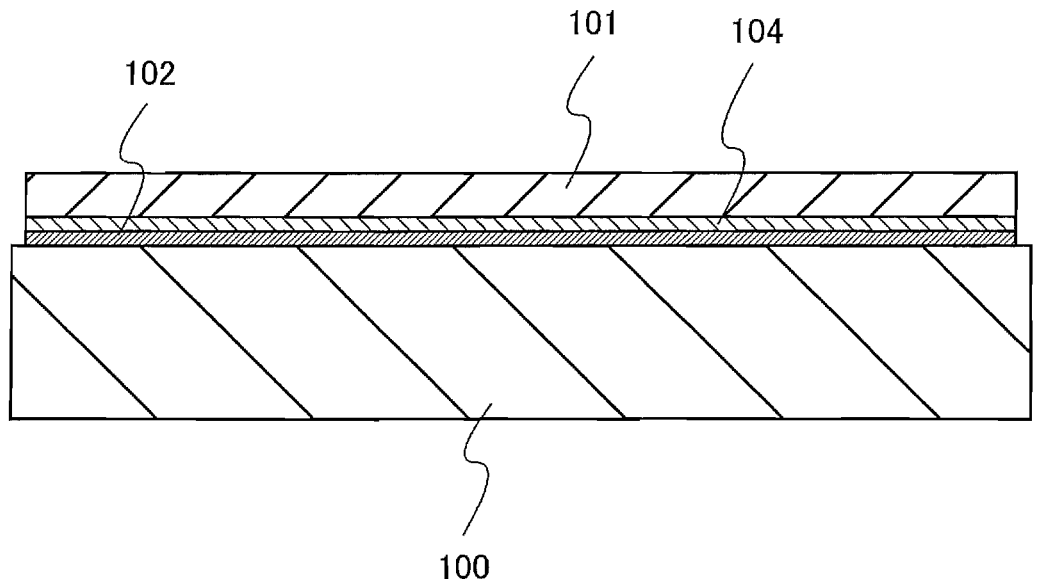
FIGS. 2A and 2B are cross-sectional views of structures of a substrate having an SOI structure.

FIG. 2A shows a structure in which an insulating layer 104 is provided between the single-crystalline semiconductor layer 101 and the bonding layer 102. The insulating layer 104 is preferably an insulating layer containing nitrogen. For example, the insulating layer 104 can be formed by stacking one or more films selected from a silicon nitride film, a silicon nitride oxide film, or a silicon oxynitride film. For example, the insulating layer 104 can be formed by stacking a silicon oxynitride film and a silicon nitride oxide film from the single-crystalline semiconductor layer 101 side. The bonding layer 102 has a function of forming a bond with the supporting substrate 100, whereas the insulating layer 104 prevents the single-crystalline semiconductor layer 101 from being contaminated by an impurity.

Note that a silicon oxynitride film means a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

Figure 2B:
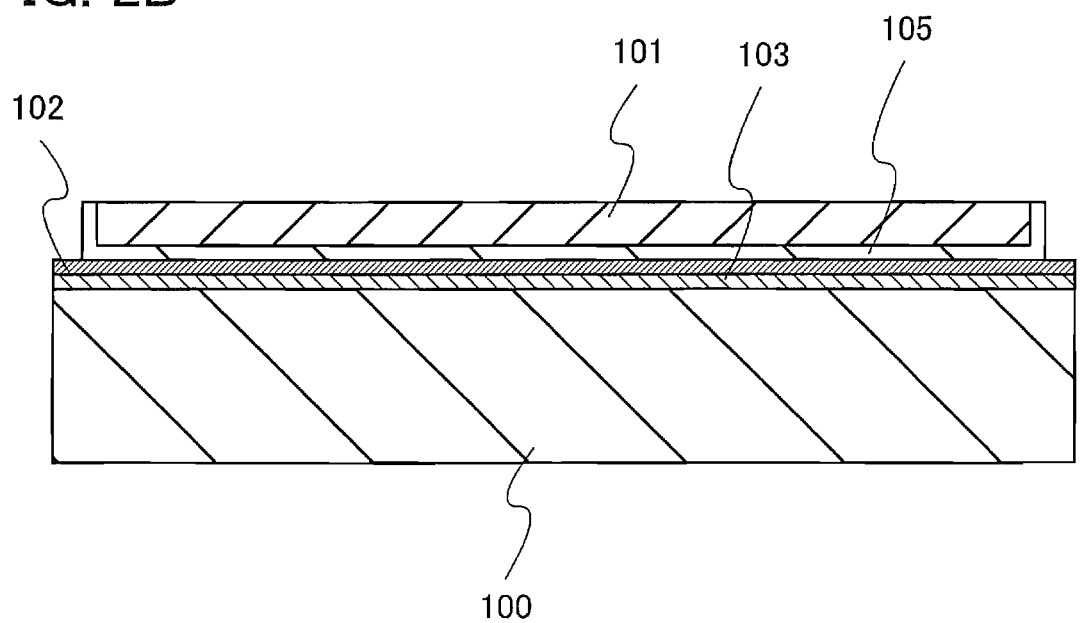

FIG. 2B shows a structure in which the bonding layer 102 is provided over the supporting substrate 100. The barrier layer 103 is preferably provided between the supporting substrate 100 and the bonding layer 102 in order to prevent the single-crystalline semiconductor layer 101 from being contaminated by diffusion of a movable ion impurity such as an alkali metal or an alkaline earth metal from the glass substrate used as the supporting substrate 100. A silicon oxide layer 105 that is formed by direct oxidation is formed on the single-crystalline semiconductor layer 101. This silicon oxide layer 105 forms a bond with the bonding layer 102 and fixes the single-crystalline semiconductor layer 101 on the supporting substrate 100. The silicon oxide layer 105 is preferably formed by thermal oxidation.

A manufacturing method of such a substrate having an SOI structure is described with reference to FIGS. 3A to 4B.

Figure 3A:
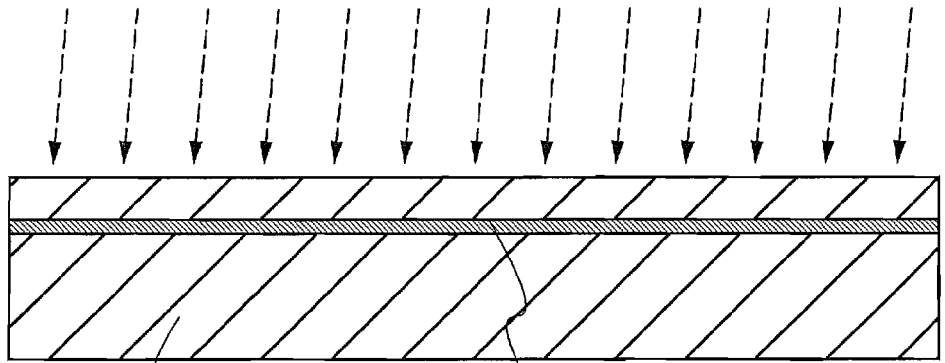
FIGS. 3A to 3C are cross-sectional views of a manufacturing method of a substrate having an SOI structure.

A separation layer 107 is formed by introducing ions accelerated by electric field from a cleaned surface of a semiconductor substrate 106 to a predetermined depth (see FIG. 3A). The depth of the separation layer 107 formed in the semiconductor substrate 106 is controlled by the acceleration energy of ions and the incident angle of the ions. The separation layer 107 is formed in a region at a depth close to the average depth of introduced ions from the surface of the semiconductor substrate 106. For example, the thickness of the single-crystalline semiconductor layer is from 5 nm to 500 nm, and preferably from 10 nm to 200 nm, and accelerating voltage in introduction of ions is determined in consideration of the thickness. The introduction of the ions is preferably conducted with an ion doping apparatus. In other words, a doping method in which plural ion species generated by making a source gas into plasma are introduced without mass separation, is used. In this embodiment mode, ions of one kind or ions of plural kinds of the same type of atom which have different masses are preferably introduced. At the ion doping, the accelerating voltage may be from 10 kV to 100 kV, and preferably from 30 kV to 80 kV; the dose may be from $1\times10^{16}$ ions/cm$^2$ to $4\times10^{16}$ ions/cm$^2$; and the beam current density may be equal to or grater than 2 µA/cm$^2$, preferably equal to or greater than 5 µA/cm$^2$, and more preferably equal to or greater than 10 µA/cm$^2$. By the introduction of ions, defects generated in the semiconductor layer can be reduced.

In the case of introducing hydrogen ions, it is preferable that H$^+$, H$_2^+$, and H$_3^+$ ions are contained and the proportion of H$_3^+$ ions is made higher, because the number of hydrogen atoms that can be introduced to a semiconductor substrate in unit time is increased and thus the time for introducing ions can be shortened. Accordingly, the region of the separation layer 107 formed in the semiconductor substrate 106 can contain hydrogen at a concentration equal to or higher than $1\times10^{20}$ atoms/cm$^3$ (preferably, $5\times10^{20}$ atoms/cm$^3$). When a region in which hydrogen is introduced at a high concentration is locally formed in the semiconductor substrate 106, the crystal structure is disordered and microcavities are formed, so that the separation layer 107 can have a porous structure. In this case, the volume of the microcavities formed in the separation layer 107 is changed by heat treatment at a relatively low temperature, and cleavage is formed along the separation layer; accordingly, a thin single-crystalline semiconductor layer can be formed.

Here, H$^+$, H$_2^+$, and H$_3^+$ ions formed from a hydrogen plasma will be described. Reaction processes (formation processes, destruction processes) of the hydrogen ion species can be explained with reaction equations shown below.

$$e+H \rightarrow e+H^+ +e \quad (1)$$

$$e+H_2 \rightarrow e+H_2^+ +e \quad (2)$$

$$e+H_2 \rightarrow >e+(H_2)^* \rightarrow e+H+H \quad (3)$$

$$e+H_2^+ \rightarrow e+(H_2^+)^* \rightarrow e+H^+ +H \quad (4)$$

$$H_2^+ + H_2 \rightarrow H_3^+ + H \quad (5)$$

$$H_2^+ + H_2 \rightarrow H^+ + H + H_2 \quad (6)$$

$$e+H_3^+ \rightarrow e+H^+ +H+H \quad (7)$$

$$e+H_3^+ \rightarrow H_2 +H \quad (8)$$

$$e+H_3^+ \rightarrow H+H+H \quad (9)$$

Figure 17:
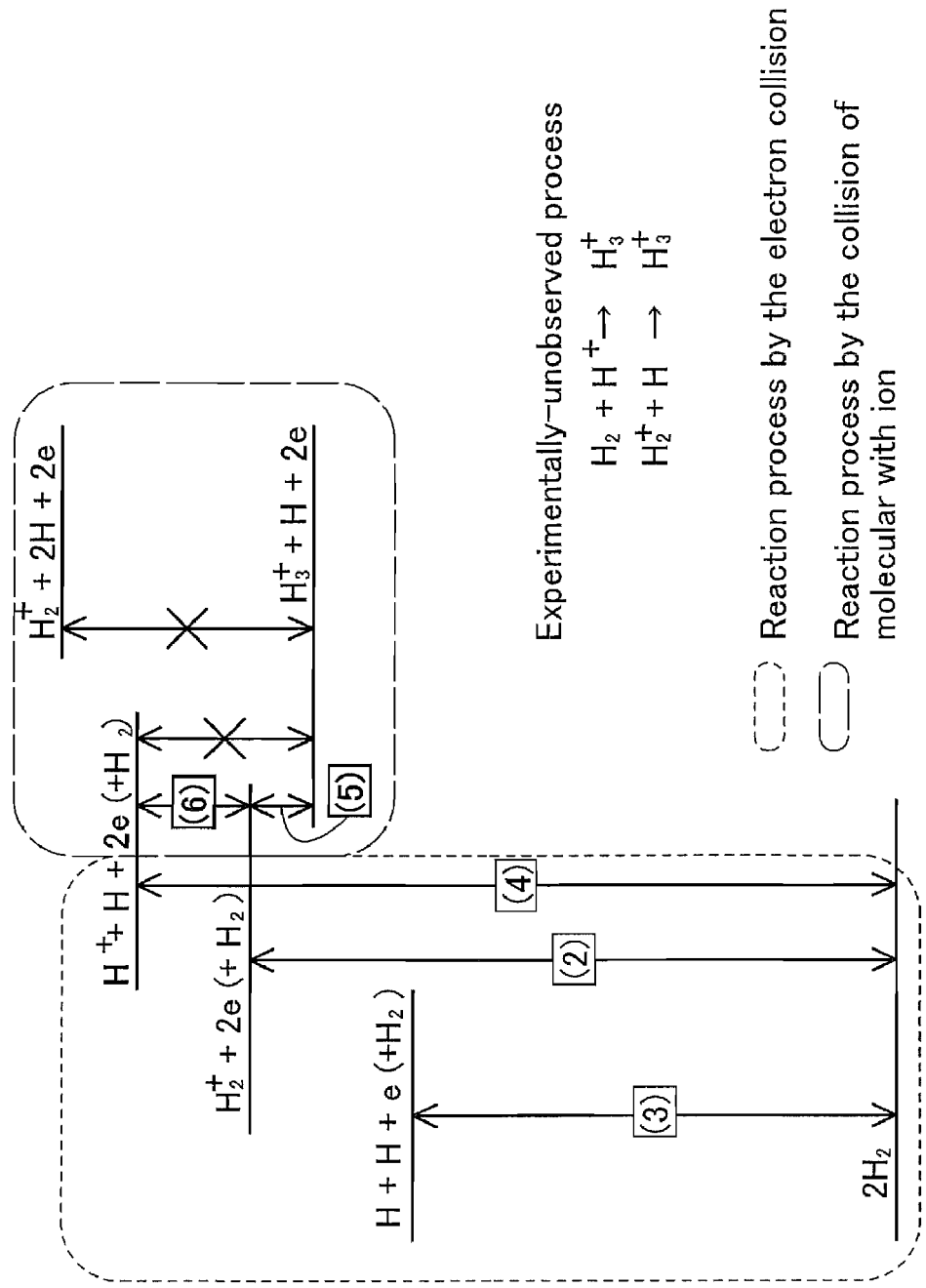
FIG. 17 is an energy diagram of hydrogen ion species.

FIG. 17 is an energy diagram which schematically shows some of the above reactions. Note that the energy diagram shown in FIG. 17 is merely a schematic diagram and does not depict the relationships of energies of the reactions exactly.

(H$_3^+$ Formation Process)

As shown above, H$_3^+$ is mainly produced through the reaction process that is represented by the reaction equation (5). On the other hand, as a reaction that competes with the reaction equation (5), there is the reaction process represented by the reaction equation (6). For the amount of H$_3^+$ to increase, at the least, it is necessary that the reaction of the reaction equation (5) occur more often than the reaction of the reaction equation (6) (note that, because there are also other reactions, (7), (8), and (9), through which the amount of H$_3^+$ is decreased, the amount of H$_3^+$ is not necessarily increased even if the reaction of the reaction equation (5) occurs more often than the reaction of the reaction equation (6)). In contrast, when the reaction of the reaction equation (5) occurs less often than the reaction of the reaction equation (6), the proportion of H$_3^+$ in a plasma is decreased.

The amount of increase in the product on the right-hand side (rightmost side) of each reaction equation given above depends on the density of a source material on the left-hand side (leftmost side) of the reaction equation, the rate coefficient of the reaction, and the like. Here, it is experimentally confirmed that, when the kinetic energy of H$_2^+$ is lower than about 11 eV, the reaction of the reaction equation (5) is the main reaction (that is, the rate coefficient of the reaction equation (5) is sufficiently higher than the rate coefficient of the reaction equation (6)) and that, when the kinetic energy of H$_2^+$ is higher than about 11 eV, the reaction of the reaction equation (6) is the main reaction.

A force is exerted on a charged particle by an electric field, and the charged particle gains kinetic energy. The kinetic energy corresponds to the amount of decrease in potential energy due to an electric field. For example, the amount of kinetic energy a given charged particle gains before colliding with another particle is equal to the difference between a potential energy at a potential before the charged particle moves and a potential energy at a potential before the collision. That is, in a situation where a charged particle can transfer a long distance in an electric field without colliding with another particle, the kinetic energy (or the average thereof) of the charged particle tends to be higher than that in a situation where the charged particle cannot. Such a tendency toward an increase in kinetic energy of a charged particle can be shown in a situation where the mean free path of a particle is long, that is, in a situation where pressure is low.

Even in a situation where the mean free path is short, the kinetic energy of a charged particle is high if the charged particle can gain a high amount of kinetic energy while traveling through the path. That is, it can be said that, even in the situation where the mean free path is short, the kinetic energy of a charged particle is high if the potential difference is large.

This is applied to H$_2^+$. Assuming that an electric field is present as in a plasma generation chamber, the kinetic energy of H$_2^+$ is high in a situation where the pressure inside the chamber is low and the kinetic energy of H$_2^+$ is low in a situation where the pressure inside the chamber is high. That is, because the reaction of the reaction equation (6) is the main reaction in the situation where the pressure inside the chamber is low, the amount of H$_3^+$ tends to be decreased, and because the reaction of the reaction equation (5) is the main reaction in the situation where the pressure inside the chamber is high, the amount of H$_3^+$ tends to be increased. In addition, in a situation where an electric field in a plasma generation region is high, that is, in a situation where the potential difference between given two points is large, the kinetic energy of H$_2^+$ is high, and in the opposite situation, the kinetic energy of H$_2^+$ is low. That is, because the reaction of the reaction equation (6) is the main reaction in the situation where the electric field is high, the amount of H$_3^+$ tends to be decreased, and because the reaction of the reaction equation (5) is the main reaction in a situation where the electric field is low, the amount of H$_3^+$ tends to be increased.

(Differences Depending on Ion Source)

Figure 18:
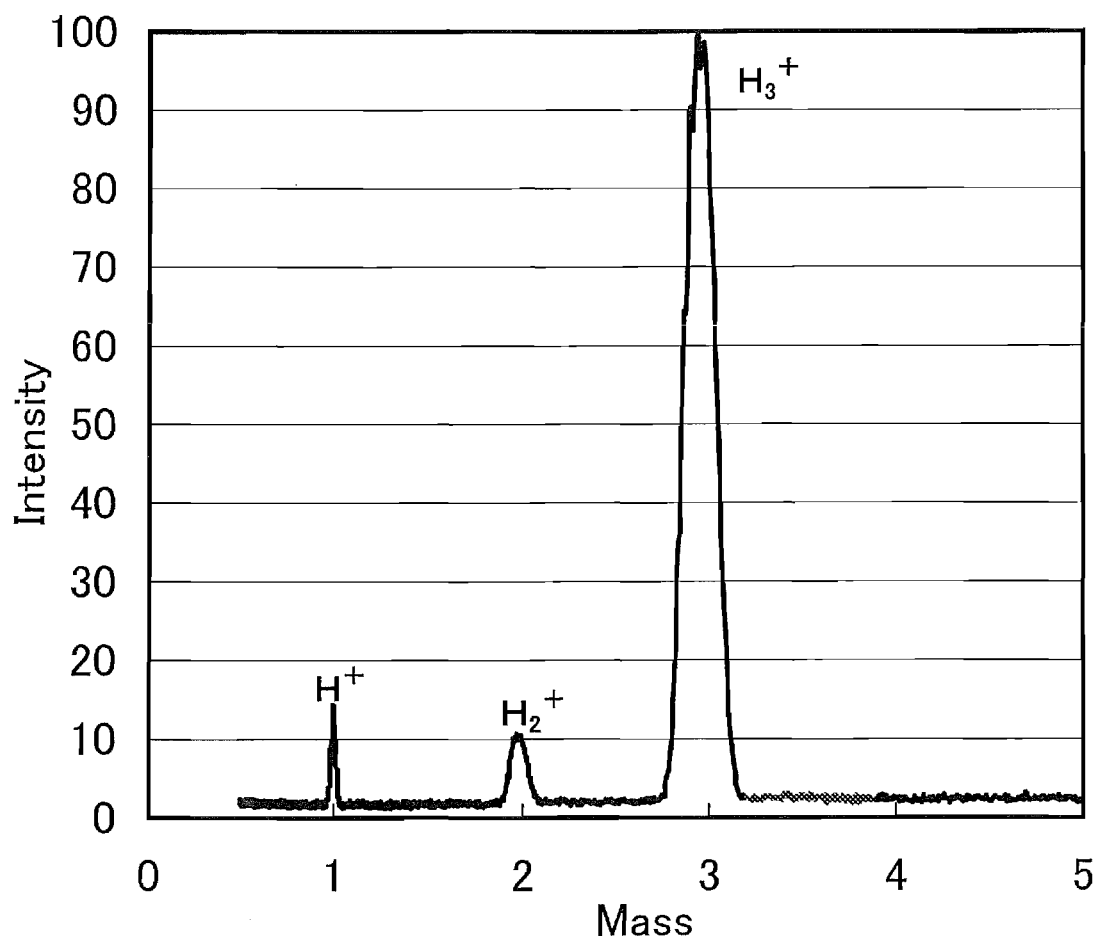
FIG. 18 is a diagram showing the results of ion mass spectrometry.

Here, an example, in which the proportions of ion species (particularly, the proportion of H$_3^+$) are different, is described. FIG. 18 is a graph showing the results of mass spectrometry of ions that are generated from a 100% hydrogen gas (with the pressure of an ion source of $4.7\times10^{-2}$ Pa).

Note that this mass spectrometry was performed by measurement of ions that were extracted from the ion source. The horizontal axis represents ion mass. In the spectrum, the mass 1 peak, the mass 2 peak, and the mass 3 peak correspond to $H^+$, $H_2^+$, and $H_3^+$, respectively. The vertical axis represents the intensity of the spectrum, which corresponds to the number of ions. In FIG. 18, the number of ions with different masses is expressed as a relative proportion where the number of ions with a mass of 3 is defined as 100. It can be seen from FIG. 18 that the ratio between ion species that are generated from the ion source, i.e., the ratio between $H^+$, $H_2^+$, and $H_3^+$, is about 1:1:8. Note that ions at such a ratio can also be generated by an ion doping apparatus which has a plasma source portion (ion source) that generates a plasma, an extraction electrode that extracts an ion beam from the plasma, and the like.

Figure 19:
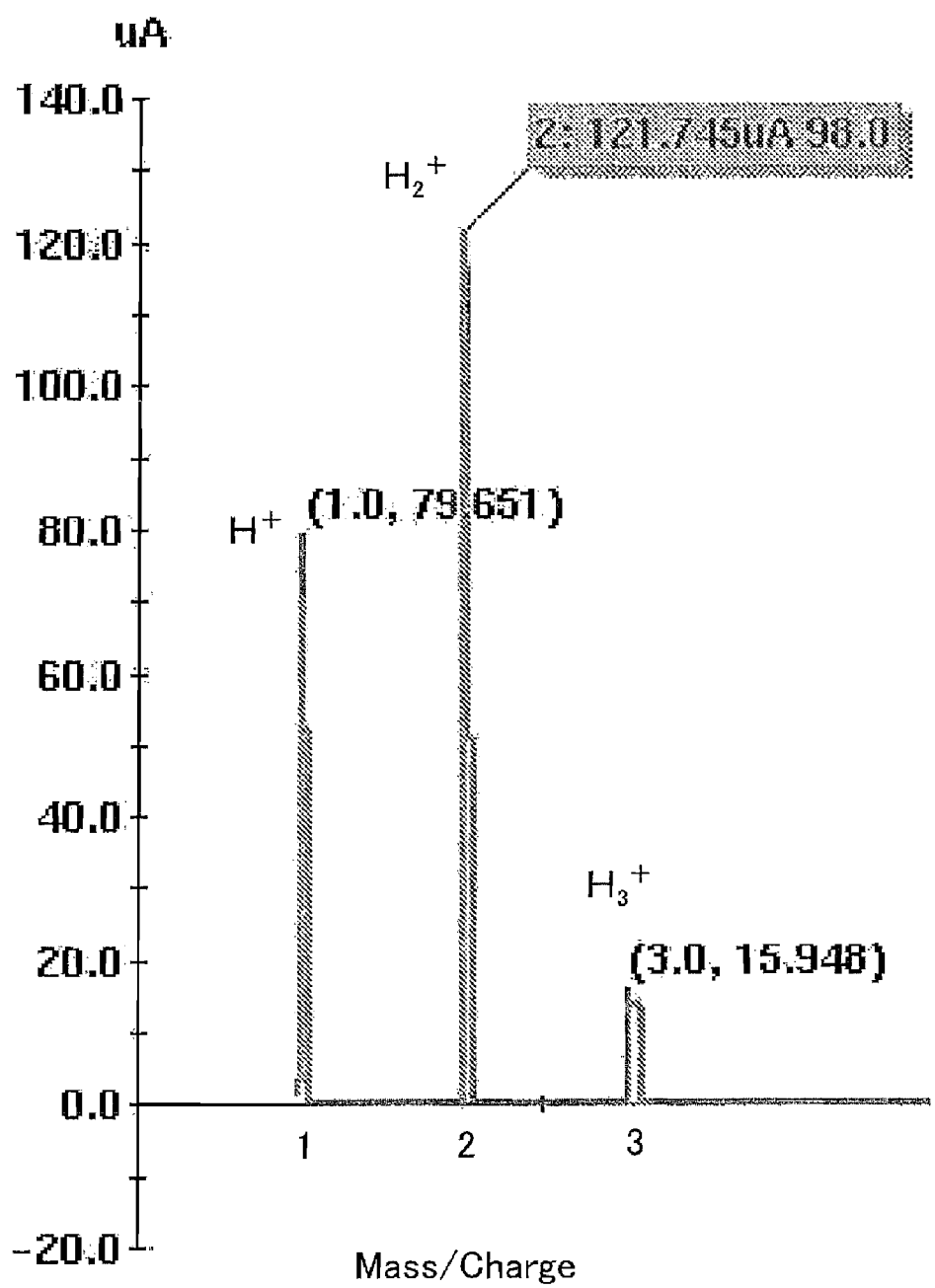
FIG. 19 is a diagram showing the results of ion mass spectrometry.

FIG. 19 is a graph showing the results of mass spectrometry of ions that are generated from $PH_3$ when an ion source different from that for the case of FIG. 18 is used and the pressure of the ion source is about $3\times10^{-3}$ Pa. The results of this mass spectrometry focus on the hydrogen ion species. In addition, the mass spectrometry was performed by measurement of ions that were extracted from the ion source. As in FIG. 18, the horizontal axis represents ion mass, and the mass 1 peak, the mass 2 peak, and the mass 3 peak correspond to $H^+$, $H_2^+$, and $H_3^+$, respectively. The vertical axis represents the intensity of a spectrum corresponding to the number of ions. It can be seen from FIG. 19 that the ratio between ion species in a plasma, i.e., the ratio between $H^+$, $H_2^+$, and $H_3^+$, is about 37:56:7. Note that, although FIG. 19 shows the data obtained when the source gas is $PH_3$, the ratio between the hydrogen ion species is about the same when a 100% hydrogen gas is used as a source gas, as well.

In the case of the ion source from which the data shown in FIG. 19 is obtained, $H_3^+$, of $H^+$, $H_2^+$, and $H_3^+$, is generated at a proportion of only about 7%. On the other hand, in the case of the ion source from which the data shown in FIG. 18 is obtained, the proportion of $H_3^+$ can be up to 50% or higher (under the aforementioned conditions, about 80%). This is thought to result from the pressure and electric field inside a chamber, which is clearly shown in the above consideration.

($H_3^+$ Irradiation Mechanism)

When a plasma that contains a plurality of ion species as shown in FIG. 18 is generated and a single-crystalline semiconductor substrate is irradiated with the generated ion species without any mass separation being performed, the surface of the single-crystalline semiconductor substrate is irradiated with each of $H^+$, $H_2^+$, and $H_3^+$ ions. In order to reproduce the mechanism, from the irradiation with ions to the formation of an ion-introduced region, the following five types of models are considered.

Model 1, where the ion species used for irradiation is $H^+$, which is still $H^+$ (H) after the irradiation.

Model 2, where the ion species used for irradiation is $H_2^+$, which is still $H_2^+$ ($H_2$) after the irradiation.

Model 3, where the ion species used for irradiation is $H_2^+$, which splits into two H atoms ($H^+$ ions) after the irradiation.

Model 4, where the ion species used for irradiation is $H_3^+$, which is still $H_3^+$ ($H_3$) after the irradiation.

Model 5, where the ion species used for irradiation is $H_3^+$, which splits into three H atoms ($H^+$ ions) after the irradiation.

(Comparison of Simulation Results with Measured Values)

Based on the above models, the irradiation of an Si substrate with hydrogen ion species was simulated. As simulation software, SRIM, the Stopping and Range of Ions in Matter (an improved version of TRIM, the Transport of Ions in Matter, which is simulation software for ion introduction processes by a Monte Carlo method) was used. Note that, for the calculation, a calculation based on Model 2 was performed with the $H_2^+$ replaced by $H^+$ that has twice the mass. In addition, a calculation based on Model 4 was performed with the $H_3^+$ replaced by $H^+$ that has three times the mass. Furthermore, a calculation based on Model 3 was performed with the $H_2^+$ replaced by $H^+$ that has half the kinetic energy, and a calculation based on Model 5, with the $H_3^+$ replaced by $H^+$ that has one-third the kinetic energy.

Note that SRIM is software intended for amorphous structures, but SRIM can be applied to cases where irradiation with the hydrogen ion species is performed with high energy at a high dose. This is because the crystal structure of an Si substrate changes into a non-single-crystal structure due to the collision of the hydrogen ion species with Si atoms.

Figure 20:
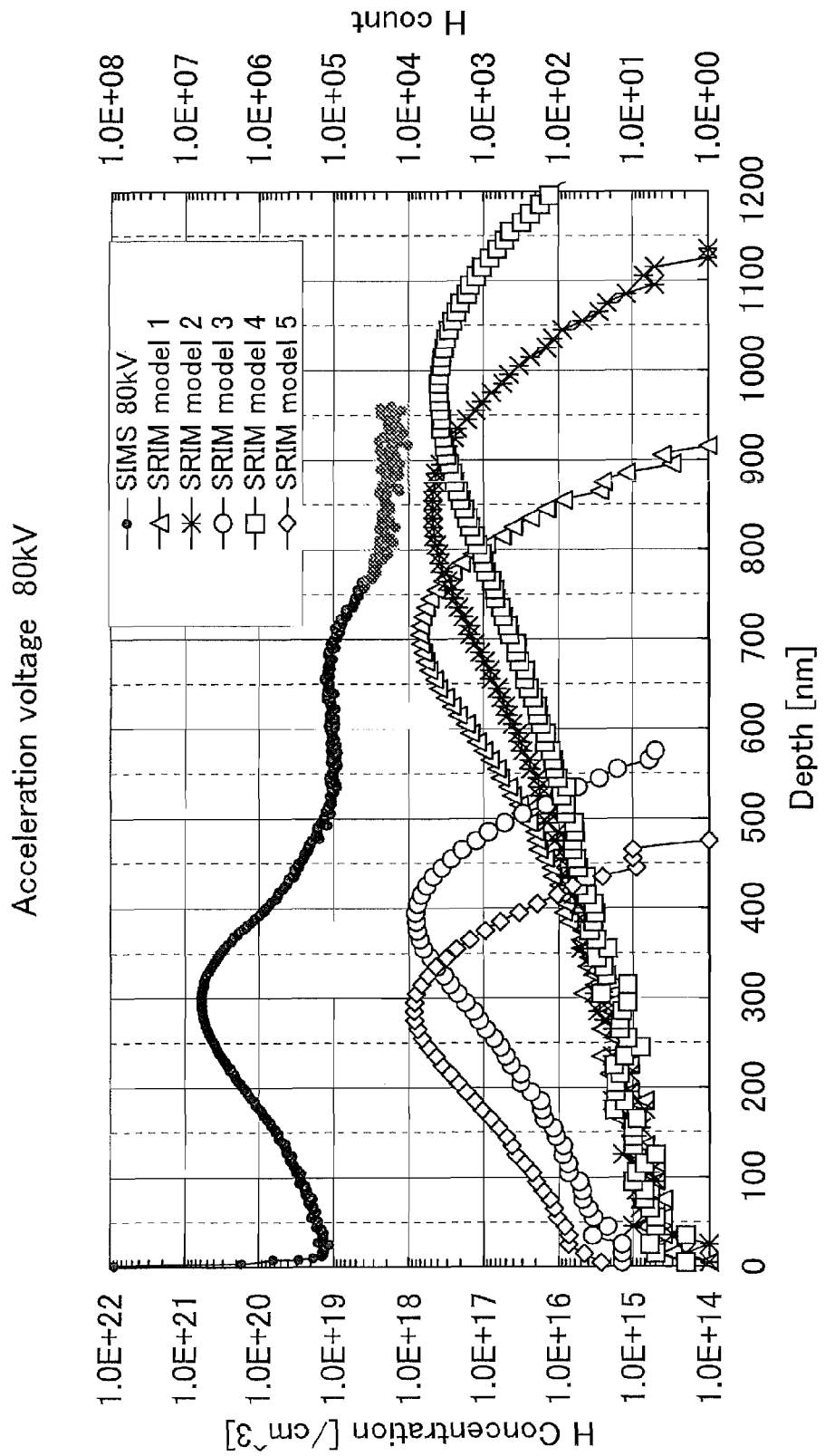
FIG. 20 is a diagram showing the profile (measured values and calculated values) of hydrogen in the depth direction when the accelerating voltage is 80 kV.

FIG. 20 shows the calculation results obtained when irradiation with the hydrogen ion species (irradiation with 100,000 atoms for H) is performed using Models 1 to 5. FIG. 20 also shows the hydrogen concentration (secondary ion mass spectrometry (SIMS) data) in an Si substrate irradiated with the hydrogen ion species of FIG. 18. The results of calculations performed using Models 1 to 5 are expressed on the vertical axis (right axis) as the number of hydrogen atoms, and the SIMS data is expressed on the vertical axis (left axis) as the density of hydrogen atoms. The horizontal axis represents depth from the surface of an Si substrate. If the SIMS data, which is measured values, is compared with the calculation results, Models 2 and 4 obviously do not match the peaks of the SIMS data and a peak corresponding to Model 3 cannot be observed in the SIMS data. This shows that the contribution of each of Models 2 to 4 is relatively small. Considering that the kinetic energy of ions is on the order of kiloelectron volts whereas the H—H bond energy is only about several electron volts, it is thought that the contribution of each of Models 2 and 4 is small because $H_2^+$ and $H_3^+$ mostly split into $H^+$ or H by colliding with Si atoms.

Figure 21:
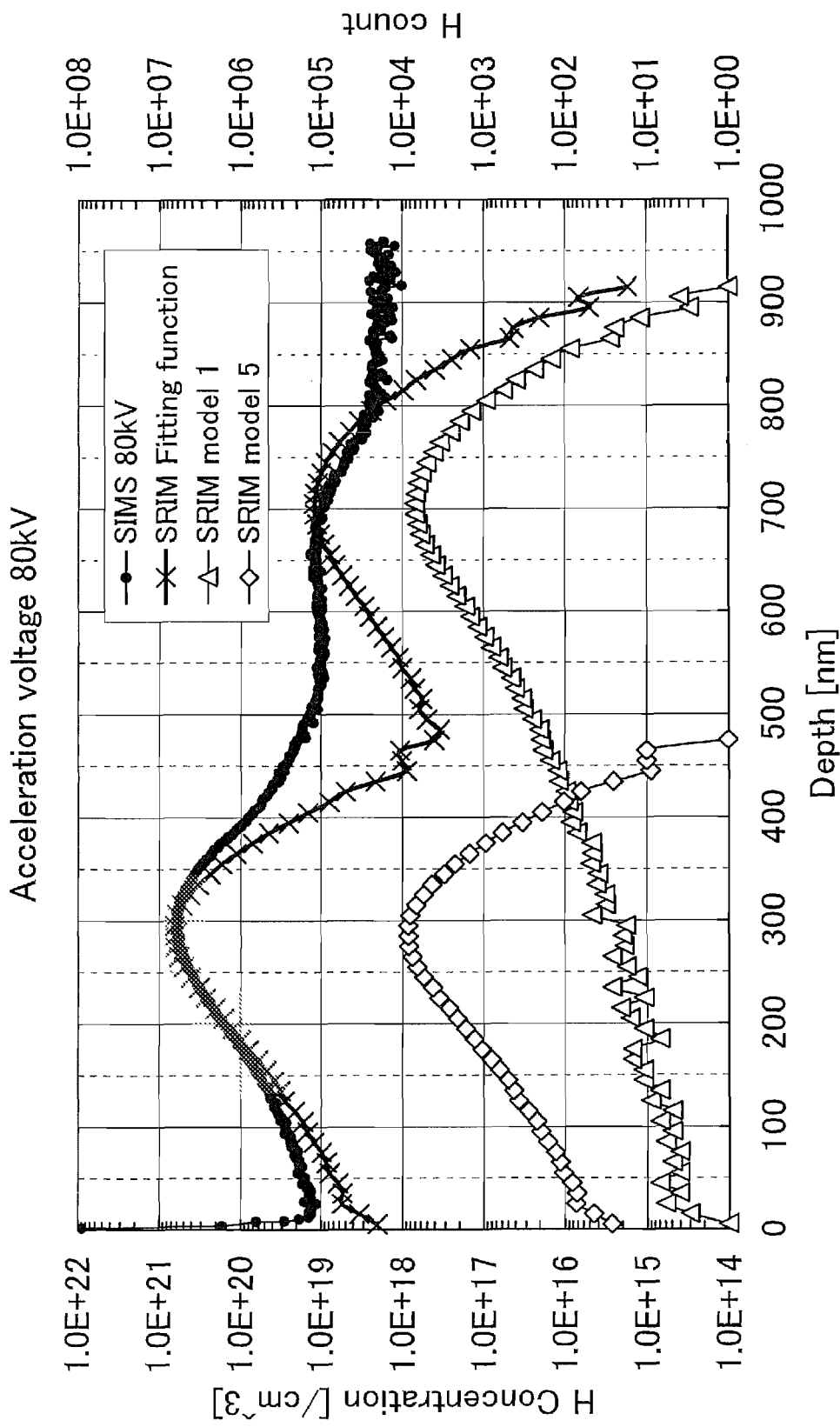
FIG. 21 is a diagram showing the profile (measured values, calculated values, and fitting functions) of hydrogen in the depth direction when the accelerating voltage is 80 kV.
Figure 22:
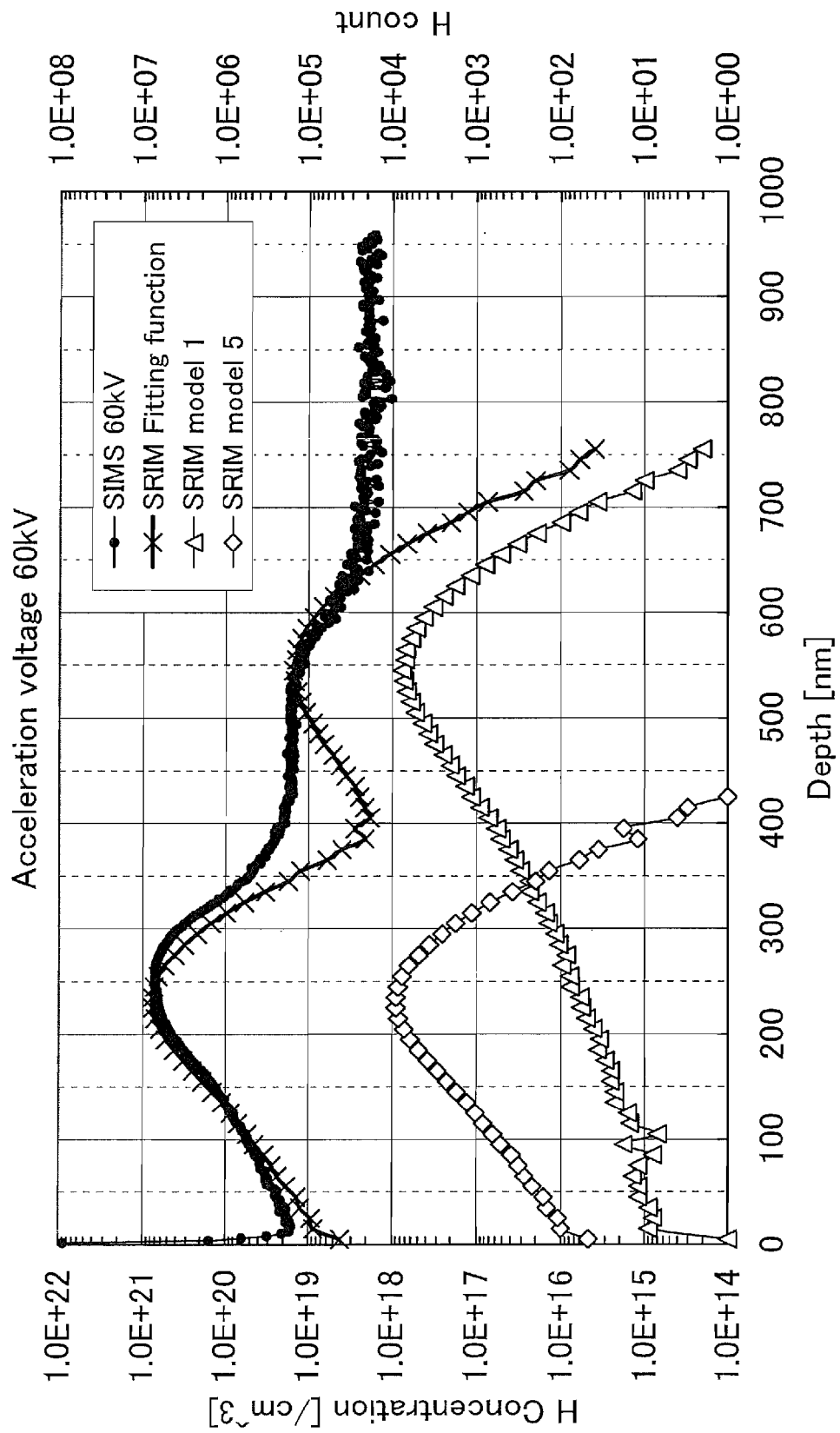
FIG. 22 is a diagram showing the profile (measured values, calculated values, and fitting functions) of hydrogen in the depth direction when the accelerating voltage is 60 kV.
Figure 23:
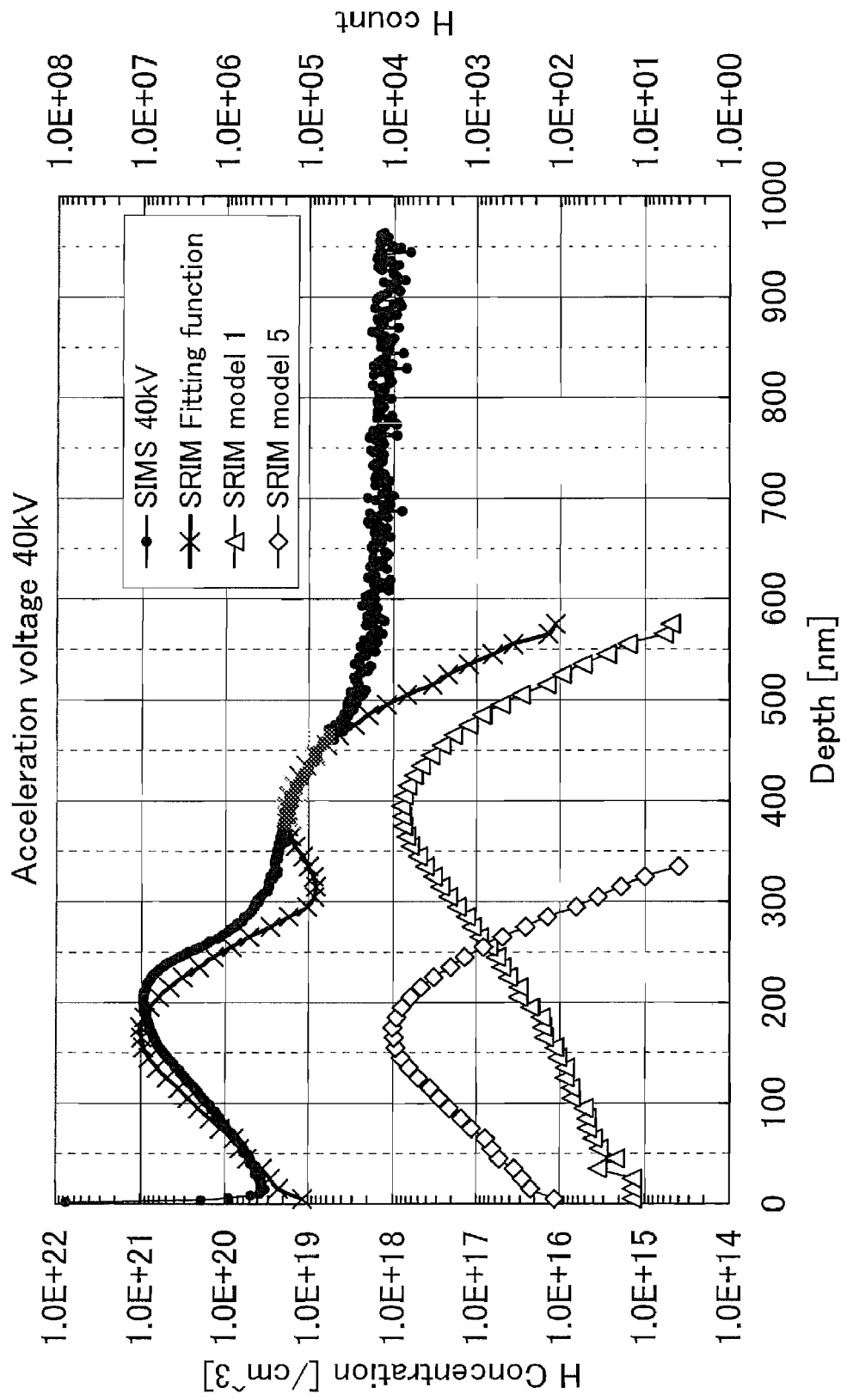
FIG. 23 is a diagram showing the profile (measured values, calculated values, and fitting functions) of hydrogen in the depth direction when the accelerating voltage is 40 kV.

Accordingly, Models 2 to 4 will not be considered hereinafter. FIGS. 21 to 23 each show the calculation results obtained when irradiation with the hydrogen ion species (irradiation with 100,000 atoms for H) is performed using Models 1 and 5. FIGS. 21 to 23 also each show the hydrogen concentration (SIMS data) in an Si substrate irradiated with the hydrogen ion species of FIG. 18, and the simulation results fitted to the SIMS data (hereinafter referred to as a fitting function). Here, FIG. 21 shows the case where the accelerating voltage is 80 kV; FIG. 22, the case where the accelerating voltage is 60 kV; and FIG. 23, the case where the accelerating voltage is 40 kV. Note that the results of calculations performed using Models 1 and 5 are expressed on the vertical axis (right axis) as the number of hydrogen atoms, and the SIMS data and the fitting function are expressed on the vertical axis (left axis) as the density of hydrogen atoms. The horizontal axis represents depth from the surface of an Si substrate.

The fitting function is obtained using the calculation formula given below, in consideration of Models 1 and 5. Note that, in the calculation formula, X and Y represent fitting parameters and V represents volume.

(Fitting Function)=$X/V$×(Data of Model 1)+$Y/V$×(Data of Model 5)

In consideration of the ratio between ion species used for actual irradiation ($H^+:H_2^+:H_3^+$ is about 1:1:8), the contribution of $H_2^+$ (i.e., Model 3) should also be considered; however, Model 3 is excluded from the consideration given here for the following reasons:

Because the amount of hydrogen introduced through the irradiation process represented by Model 3 is lower than that introduced through the irradiation process of Model 5, there is no significant influence even if Model 3 is excluded from the consideration (no peak appears in the SIMS data either).

Model 3, the peak position of which is close to that of Model 5, is likely to be obscured by channeling (movement of atoms due to crystal lattice structure) that occurs in Model 5. That is, it is difficult to estimate fitting parameters for Model 3. This is because this simulation assumes amorphous Si and the influence due to crystallinity is not considered.

FIG. 24 lists the aforementioned fitting parameters. At any of the accelerating voltages, the ratio of the amount of H introduced according to Model 1 to that introduced according to Model 5 is about 1:42 to 1:45 (the amount of H in Model 5, when the amount of H in Model 1 is defined as 1, is about 42 to 45), and the ratio of the number of ions used for irradiation, $H^+$ (Model 1) to that of $H_3^+$ (Model 5) is about 1:14 to 1:15 (the amount of $H_3^+$ in Model 5, when the amount of $H^+$ in Model 1 is defined as 1, is about 14 to 15). Considering that Model 3 is not considered and the calculation assumes amorphous Si, it can be said that values close to that of the ratio between ion species used for actual irradiation $H^+:H_2^+:H_3^+$ is about 1:1:8) is obtained.

(Effects of Use of $H_3^+$)

A plurality of benefits resulting from $H_3^+$ can be enjoyed by irradiation of a substrate with hydrogen ion species with a higher proportion of $H_3^+$ as shown in FIG. 18. For example, because $H_3^+$ splits into $H^+$, H, or the like to be introduced into a substrate, ion introduction efficiency can be improved compared with the case of irradiation mainly with $H^+$ or $H_2^+$. This leads to an improvement in semiconductor substrate production efficiency. In addition, because the kinetic energy of $H^+$ or H after $H_3^+$ splits similarly tends to be low, $H_3^+$ is suitable for manufacture of thin semiconductor layers.

Note that, in this specification, a method is described in which an ion doping apparatus that is capable of irradiation with the hydrogen ion species as shown in FIG. 18 is used in order to efficiently perform irradiation with $H_3^+$. Ion doping apparatuses are inexpensive and excellent for use in large-area treatment. Therefore, by irradiation with $H_3^+$ by use of such an ion doping apparatus, significant effects such as an improvement in semiconductor characteristics, an increase in area, a reduction in costs, and an improvement in production efficiency can be obtained. On the other hand, if first priority is given to irradiation with $H_3^+$, there is no need to interpret the present invention as being limited to the use of an ion irradiation apparatus.

Even when the ions are mass-separated and introduced to the semiconductor substrate 106, the separation layer 107 can be formed similarly. In this case also, it is preferable that ions with a large mass (e.g., $H_3^+$ ions) be selected and introduced to the semiconductor substrate since the effect similar to the above can be obtained.

Other than hydrogen, deuterium or an inert gas such as helium can also be selected as the gas from which ion species are generated. When helium is used as a source gas and an ion doping apparatus which does not have a mass-separation function is used, an ion beam with a high proportion of $He^+$ ions can be obtained. By introducing such ions to the semiconductor substrate 106, microcavities can be formed and the separation layer 107 similar to the above can be provided in the semiconductor substrate 106.

Since introduction of ions needs to be conducted in high dose conditions in formation of the separation layer, a surface of the semiconductor substrate 106 becomes rough in some cases. Therefore, a dense film may be provided on the surface to which ions are to be introduced. For example, a silicon nitride film, a silicon nitride oxide film, or the like having a thickness of 50 nm to 200 nm may be provided as a protective film against ion introduction.

Figure 3B:
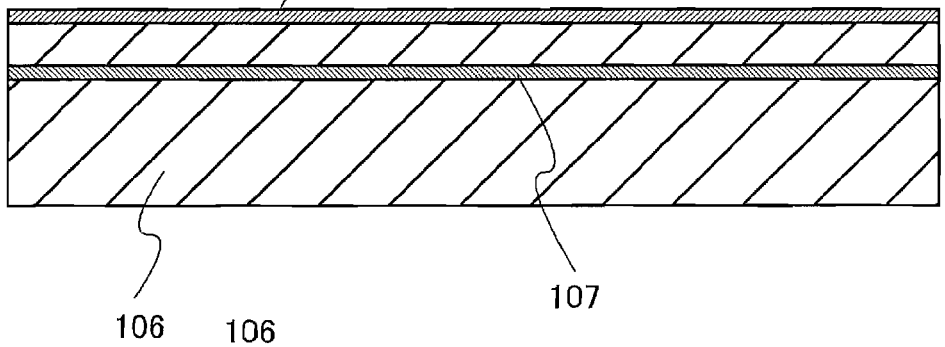

Next, a silicon oxide film is formed as the bonding layer 102 on the surface on the side of forming a bond with a supporting substrate (see FIG. 3B). The thickness of the silicon oxide film may be set at 10 nm to 200 nm, preferably 10 nm to 100 nm, and more preferably 20 nm to 50 nm. As the silicon oxide film, a silicon oxide film formed by chemical vapor deposition using an organic silane gas in the above-described manner is preferable. Another silicon oxide film formed by chemical vapor deposition using a silane gas can also be used. In the film formation by chemical vapor deposition, a film formation temperature of, for example, 350° C. or lower is employed as such a temperature that does not cause degassing from the separation layer 107 formed in the single-crystalline semiconductor substrate. In addition, heat treatment for separating the single-crystalline semiconductor layer from a single-crystalline or polycrystalline semiconductor substrate is carried out at a heat treatment temperature higher than the film formation temperature.

Figure 3C:
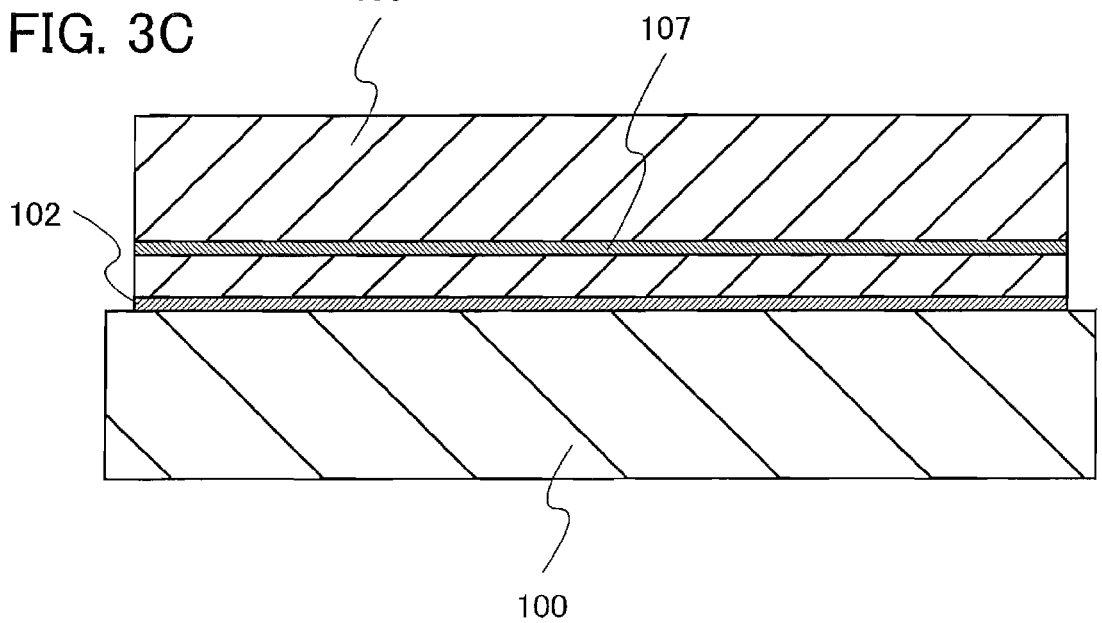

The supporting substrate 100 and a surface of the bonding layer 102 which is formed on the semiconductor substrate 106 are faced each other and made in close contact, thereby forming a bond (FIG. 3C). The surfaces which form the bond are cleaned sufficiently. By making the supporting substrate 100 and the surface of the bonding layer 102 face each other and pressing one part thereof from the outside, van der Waals force is increased due to reduction in distance between the surfaces and contribution of hydrogen bonding, so that the supporting substrate 100 and the surface of the bonding layer 102 are bonded. Further, since the facing surfaces of the supporting substrate 100 and the bonding layer 102 are made in close contact in a region near the pressed part, the bonded area spreads to the entire surfaces.

To form a favorable bond, one or both of surfaces that form a bond may be activated. For example, a surface that forms a bond is irradiated with an atomic beam or an ion beam. In the case of utilizing the atomic beam or the ion beam, an inert gas neutral atomic beam or an inert gas ion beam of argon or the like can be used. Alternatively, plasma irradiation or radical treatment may be conducted. By such surface treatment, even at a temperature of 200° C. to 400° C., the bonding strength between different kinds of materials can be increased.

Figure 4A:
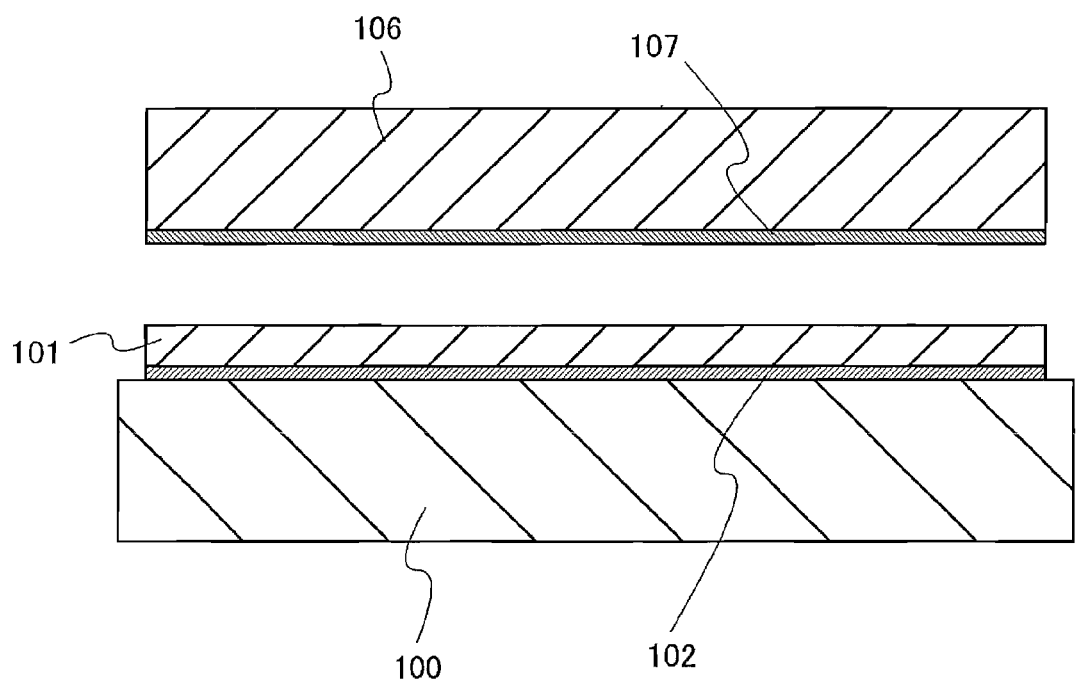
FIGS. 4A and 4B are cross-sectional views of a manufacturing method of a substrate having an SOI structure.

First heat treatment is conducted with the semiconductor substrate 106 and the supporting substrate 100 superposed on each other. By the first heat treatment, the semiconductor substrate 106 is separated in the state that a thin semiconductor layer (single-crystalline semiconductor layer 101) remains over the supporting substrate 100 (FIG. 4A). The first heat treatment is preferably conducted at a temperature equal to or higher than a film formation temperature of the bonding layer 102, and specifically, at a temperature equal to or higher than 400° C. and lower than 600° C. By conducting heat treatment at a temperature within this temperature range, the volume of microcavities formed in the separation layer 107 is changed, so that a semiconductor substrate 106 can be cleaved along the separation layer 107. Since the bonding layer 102 and the supporting substrate 100 are bonded, the single-crystalline semiconductor layer 101 having the same crystallinity as the semiconductor substrate 106 is fixed on the supporting substrate 100. By this heat treatment, a covalent bond is generated from the hydrogen bond, and the bonding strength is increased.

Figure 4B:
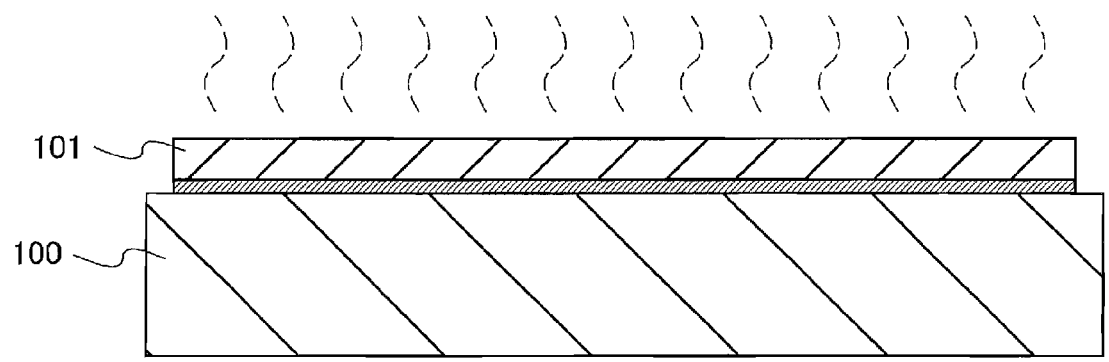

Next, second heat treatment is conducted in the state that the single-crystalline semiconductor layer 101 is bonded to the supporting substrate 100 (FIG. 4B). The second heat treatment is preferably conducted at a temperature which is higher than the temperature of the first heat treatment and does not exceed a strain point of the supporting substrate 100. Alternatively, when the first heat treatment and the second heat treatment are conducted at the same temperature, it is preferable that the treatment time of the second heat treatment be set to be longer. In the heat treatment, the supporting substrate 100 and/or the single-crystalline semiconductor layer 101 may be heated by thermal conduction heating, convection heating, radiation heating, or the like. As a heat treatment apparatus, an electrically-heated oven, a lamp anneal furnace, or the like can be used. The second heat treatment may be conducted at multiple temperatures by changing the temperature. Further, a rapid thermal annealing (RTA) apparatus may also be used. In the case of conducting heat treatment with an RTA apparatus, the heat treatment can be conducted at a temperature close to a strain point of a substrate or a little higher than the strain point.

By the second heat treatment, the residual stress in the single-crystalline semiconductor layer 101 can be relaxed. That is, by the second heat treatment, thermal distortion generated due to difference in coefficient of expansion between the supporting substrate 100 and the single-crystalline semiconductor layer 101 is relaxed. The second heat treatment is also effective for recovering crystallinity of the single-crystalline semiconductor layer 101 whose crystallinity is damaged by ion introduction. Further, the second heat treatment is also effective for recovering damages of the single-crystalline semiconductor layer 101, which have been caused in separation by the first heat treatment after bonding the semiconductor substrate 106 and the supporting substrate 100. Furthermore, by the first heat treatment and the second heat treatment, a hydrogen bond can be changed into a stronger covalent bond. Since the heat capacity of a sample becomes smaller by separating the semiconductor substrate 106, the amount of heat required for the second heat treatment is reduced. By the second heat treatment, the semiconductor substrate 106 is separated from the single-crystalline semiconductor layer 101; accordingly, damages to the surface of the single-crystalline semiconductor layer 101 can be prevented.

Chemical mechanical polishing (CMP) treatment may be conducted in order to planarize the surface of the single-crystalline semiconductor layer 101. The CMP treatment can be conducted after the first heat treatment or the second heat treatment. In fact, if the CMP treatment is conducted before the second heat treatment, the surface of the single-crystalline semiconductor layer 101 can be planarized and a damaged layer on the surface generated by the CMP treatment can be restored by the second heat treatment.

In either case, by combining the first heat treatment and the second heat treatment as in this embodiment mode, a crystalline semiconductor layer having excellent crystallinity can be provided over a supporting substrate that is weak to heat such as a glass substrate.

Figure 5A:
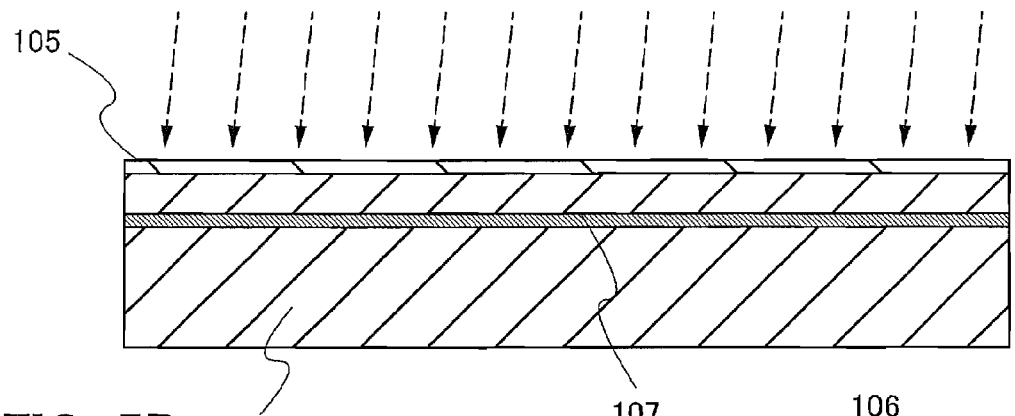
FIGS. 5A to 5C are cross-sectional views of a manufacturing method of a substrate having an SOI structure.
Figure 5B:
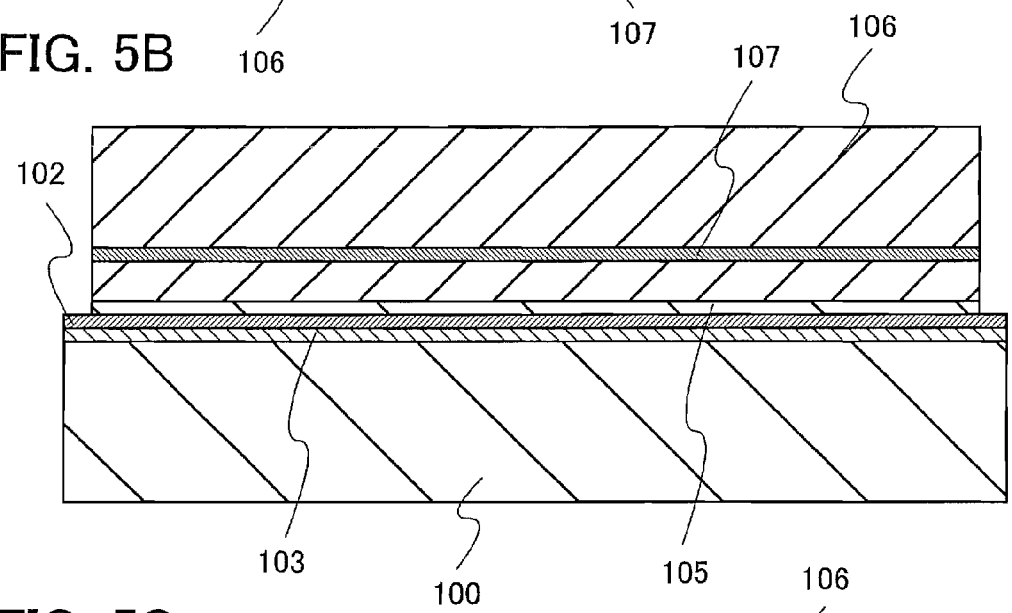
Figure 5C:
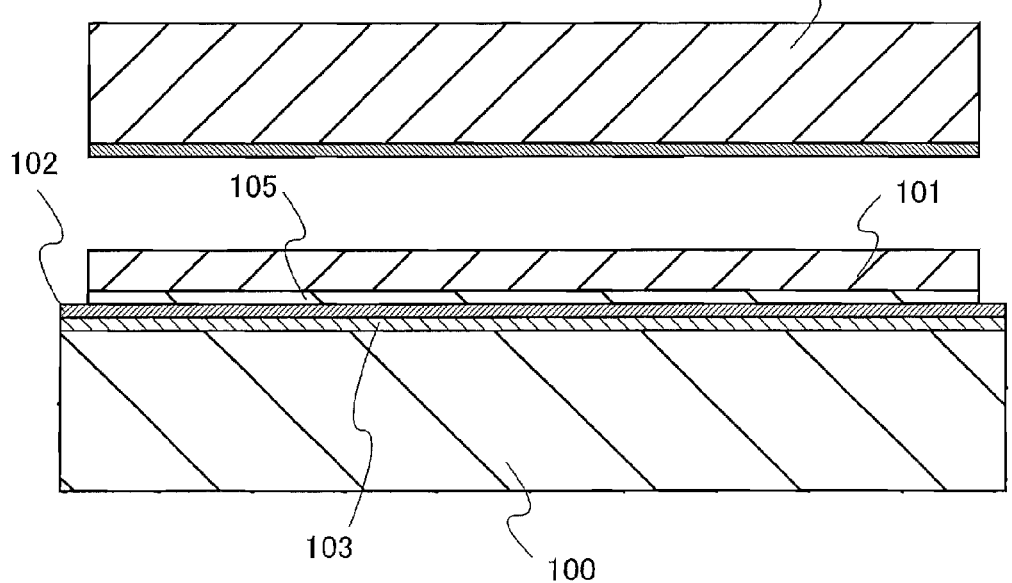

FIGS. 5A to 5C show a manufacturing process of a substrate with an SOI structure, which has a single-crystalline semiconductor layer and in which a bonding layer is provided on the supporting substrate side.

Ions accelerated by electric field are introduced to a predetermined depth of the semiconductor substrate 106 on which a silicon oxide layer 105 is formed, and the separation layer 107 is formed (FIG. 5A). The introduction of the ions is conducted similarly to the case of FIG. 3A. By forming the silicon oxide layer 105 on the surface of the semiconductor substrate 106, the surface can be prevented from being damaged by the introduction of the ions; therefore, loss of planarity can be prevented.

The supporting substrate 100 over which the barrier layer 103 and the bonding layer 102 are formed and a surface of the silicon oxide layer 105 provided on the semiconductor substrate 106 are made in close contact with each other and a bond is formed (FIG. 5B). In this state, first heat treatment is conducted. The first heat treatment is preferably conducted at a temperature equal to or higher than a film formation temperature of the bonding layer 102, and specifically at a temperature equal to or higher than 400° C. and lower than 600° C. By this heat treatment, the volume of microcavities formed in the separation layer 107 is changed, and the semiconductor substrate 106 can be cleaved. The single-crystalline semiconductor layer 101 having the same crystallinity as the semiconductor substrate 106 is formed over the supporting substrate 100 (FIG. 5C).

Next, second heat treatment is conducted in the state where the single-crystalline semiconductor layer 101 is bonded to the supporting substrate 100. The second heat treatment is preferably conducted at a temperature which is higher than the temperature of the first heat treatment and does not exceed a strain point of the supporting substrate 100. Alternatively, when the first heat treatment and the second heat treatment are conducted at the same temperature, it is preferable that the treatment time of the second heat treatment be set to be longer. In the heat treatment, the supporting substrate 100 and/or the single-crystalline semiconductor layer 101 may be heated by thermal conduction heating, convection heating, radiation heating, or the like. By the second heat treatment, the residual stress in the single-crystalline semiconductor layer 101 can be relaxed. The second heat treatment is also effective in recovering damages of the single-crystalline semiconductor layer 101, which have been caused in separation by the first heat treatment.

Figure 16A:
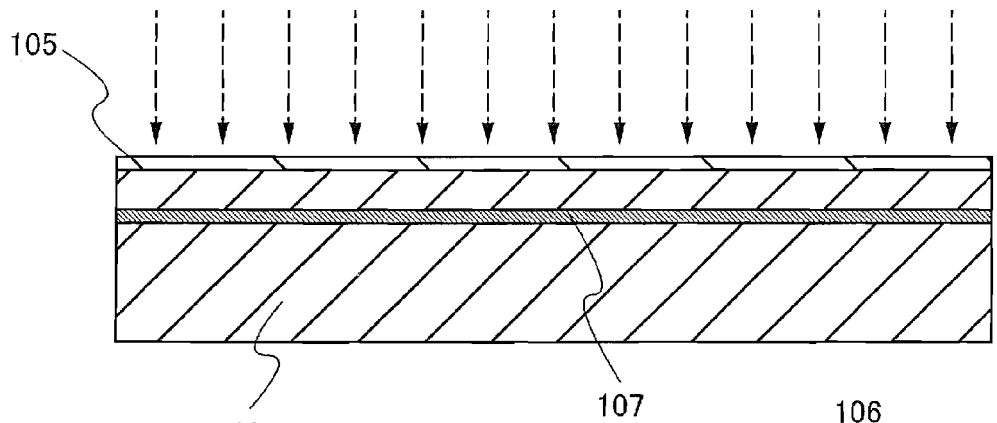
FIGS. 16A to 16C are cross-sectional views of a manufacturing method of a substrate having an SOI structure.
Figure 16B:
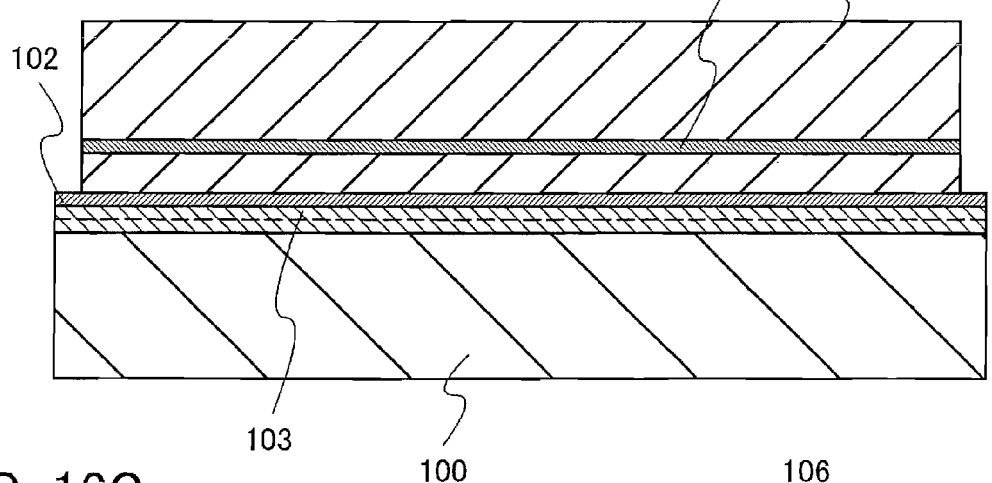
Figure 16C:
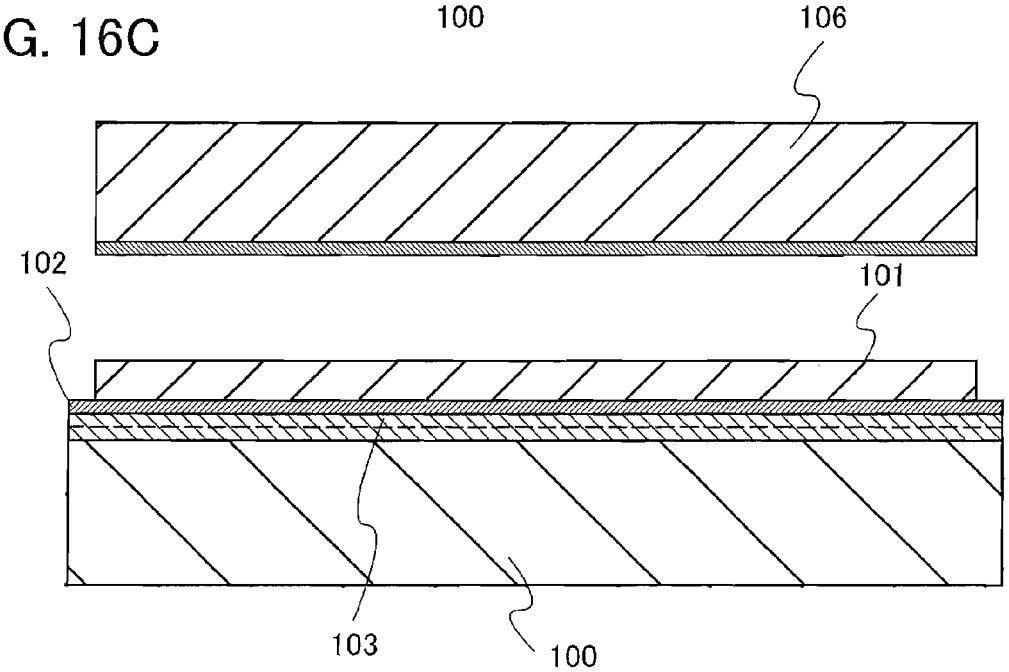

FIGS. 16A to 16C show another mode in the case where a bonding layer is provided on the supporting substrate side and a single-crystalline semiconductor layer is bonded. First, the separation layer 107 is formed in the semiconductor substrate 106 (FIG. 16A). The introduction with ions for forming the separation layer 107 is conducted with an ion doping apparatus. In this step, the semiconductor substrate 106 is irradiated with plural kinds of ions with different masses which are accelerated by high electric field. Since there is a possibility of damaging the planarity of the surface of the semiconductor substrate 106 by irradiation with the ions, the silicon oxide layer 105 is preferably provided as a protective film. The silicon oxide layer 105 may be formed by thermal oxidation or employing a chemical oxide. The chemical oxide can be formed by soaking the semiconductor substrate 106 in an oxidizing chemical solution. For example, a chemical oxide is fowled on the surface when the semiconductor substrate 106 is treated with an ozone-containing aqueous solution. Alternatively, any of a silicon oxynitride film, silicon nitride oxide film, and a silicon oxide film formed using TEOS, which are formed by a plasma CVD method, may be used.

The barrier layer 103 is preferably provided for the supporting substrate 100. By providing the barrier layer 103, the single-crystalline semiconductor layer 101 can be prevented from being contaminated by diffusion of a movable ion impurity such as an alkali metal or an alkaline earth metal from the glass substrate used as the supporting substrate 100. The barrier layer 103 has one layer or a plurality of layers. For example, a silicon nitride film or a silicon nitride oxide film, which is highly effective in blocking ions of sodium or the like, is used as a first layer, and a silicon oxide film or a silicon oxynitride film is provided as a second layer thereon. The first layer is a dense insulating film to prevent diffusion of impurities, whereas the second layer is provided for relaxing stress so that internal stress of the first film does not affect an upper layer. By providing the barrier layer 103 for the supporting substrate 100, the substrate to be bonded to a single-crystalline semiconductor layer can be selected from a wider range.

The semiconductor substrate 106 and the supporting substrate 100 over which the bonding layer 102 is provided as an upper layer of the barrier layer 103 are bonded (FIG. 16B). The silicon oxide layer 105 provided as a protective film on the surface of the semiconductor substrate 106 is removed with hydrofluoric acid, and the surface of the semiconductor is exposed. The outermost surface of the semiconductor substrate 106 is preferable as long as it is terminated by hydrogen by treatment using a hydrofluoric acid solution. In formation of the bond, a hydrogen bond is formed by hydrogen termination of the surface, and a favorable bond can be formed. Further, irradiation with ions of an inert gas may be conducted so that a dangling bond is exposed on the outermost surface of the semiconductor substrate 106, and a bond may be formed in vacuum.

In this state, first treatment is conducted. The first heat treatment is preferably conducted at a temperature equal to or higher than a film formation temperature of the bonding layer 102, and specifically at a temperature equal to or higher than 400° C. and lower than 600° C. By this heat treatment, the volume of microcavities formed in the separation layer 107 is changed, and the semiconductor substrate 106 can be cleaved. The single-crystalline semiconductor layer 101 having the same crystallinity as the semiconductor substrate 106 is formed over the supporting substrate 100 (FIG. 16C).

Next, second heat treatment is conducted in the state where the single-crystalline semiconductor layer 101 is bonded to the supporting substrate 100. The second heat treatment is preferably conducted at a temperature which is higher than the temperature of the first heat treatment and does not exceed a strain point of the supporting substrate 100. Alternatively, when the first heat treatment and the second heat treatment are conducted at the same temperature, it is preferable that the treatment time of the second heat treatment be set to be longer. In the heat treatment, the supporting substrate 100 and/or the single-crystalline semiconductor layer 101 may be heated by thermal conduction heating, convection heating, radiation heating, or the like. By the second heat treatment, the residual stress in the single-crystalline semiconductor layer 101 can be relaxed. The second heat treatment is also effective in recovering damages of the single-crystalline semiconductor layer 101, which have been caused in separation by the first heat treatment.

According to this embodiment mode, even when the supporting substrate 100 having an allowable temperature limit of 700° C. or lower such as a glass substrate is used, the single-crystalline semiconductor layer 101 which can be strongly bonded in a bonding portion can be obtained. As the supporting substrate 100, a variety of glass substrates that are used in the electronics industry and that are called non-alkali glass substrates, such as aluminosilicate glass substrates, aluminoborosilicate glass substrates, and barium borosilicate glass substrates can be used. In other words, a single-crystalline semiconductor layer can be formed over a substrate that is longer than one meter on each side. With the use of such a large-area substrate, not only a display device such as a liquid crystal display but also a semiconductor integrated circuit can be manufactured.

Figure 6A:
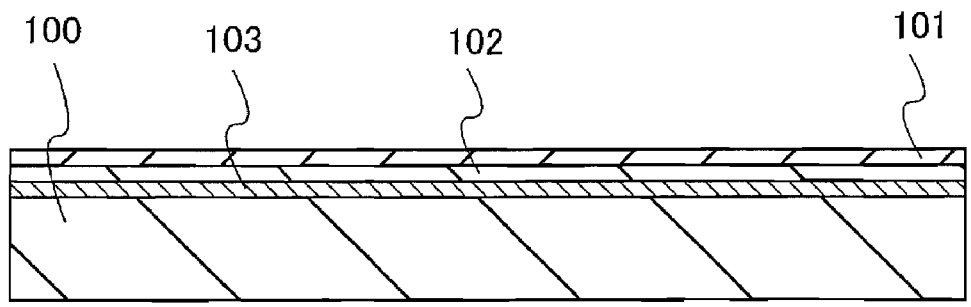
FIGS. 6A to 6D are cross-sectional views of a manufacturing method of a semiconductor device using a substrate having an SOI structure.

Next, a semiconductor device of this embodiment mode is described with reference to FIGS. 6A to 7. First, the single-crystalline semiconductor layer 101 is provided over the supporting substrate 100 with the bonding layer 102 interposed therebetween (FIG. 6A). The thickness of the single-crystalline semiconductor layer 101 is from 5 nm to 500 nm, preferably from 10 nm to 200 nm, and more preferably 10 nm to 60 nm. The thickness of the single-crystalline semiconductor layer 101 can be appropriately set by controlling the depth of the separation layer 107 as described with reference to FIGS. 3A to 3C. To control the threshold voltage, a p-type impurity element such as boron, aluminum, or gallium is added to the single-crystalline semiconductor layer 101. For example, boron may be added as a p-type impurity element at a concentration equal to or higher than $1 \times 10^{16}$ cm$^{-3}$ and equal to or lower than $1 \times 10^{18}$ cm$^{-3}$. A stack of a silicon nitride layer and a silicon oxide layer is formed as the barrier layer 103 for the supporting substrate 100. By provision of the barrier layer for the supporting substrate 100, contamination of the single-crystalline semiconductor layer 101 can be prevented. Note that instead of the silicon nitride layer, a silicon nitride oxide layer, an aluminum nitride layer, or an aluminum nitride oxide layer may be used.

Figure 6B:
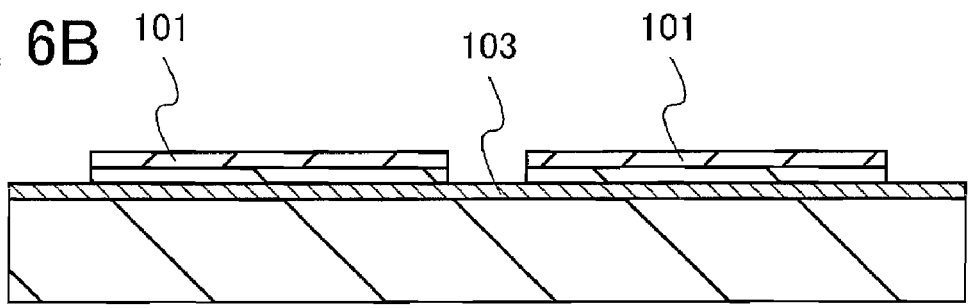
Figure 6C:
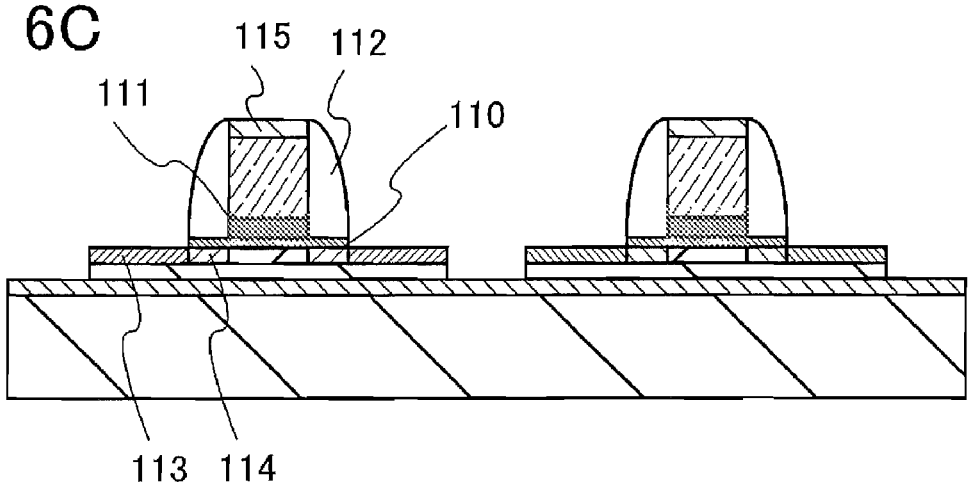
Figure 7:
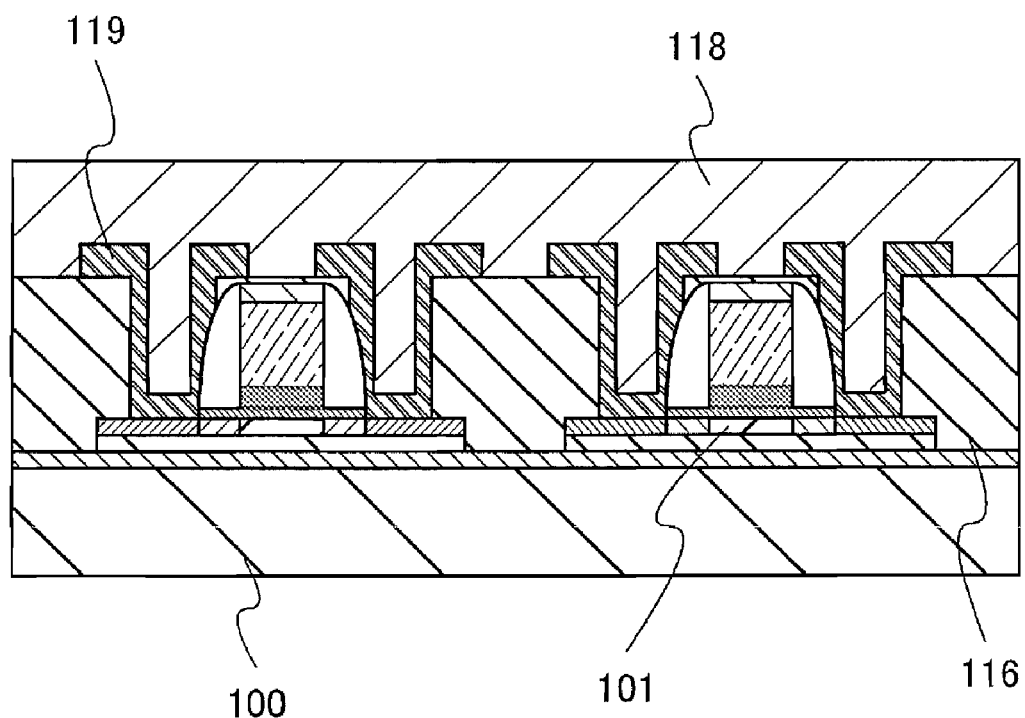
FIG. 7 is a cross-sectional view of a manufacturing method of a semiconductor device using a substrate having an SOI structure.

The single-crystalline semiconductor layer 101 is etched and separated into island shapes in accordance with arrangement of semiconductor elements (FIG. 6B). After the island-shaped single-crystalline semiconductor layers 101 are exposed, gate insulating layers 110, gate electrodes 111, and sidewall insulating layers 112 are formed, and then first impurity regions 113 and second impurity regions 114 are formed (FIG. 6C). An insulating layer 115 is formed using silicon nitride and used as a hard mask in etching the gate electrodes 111.

Figure 6D:
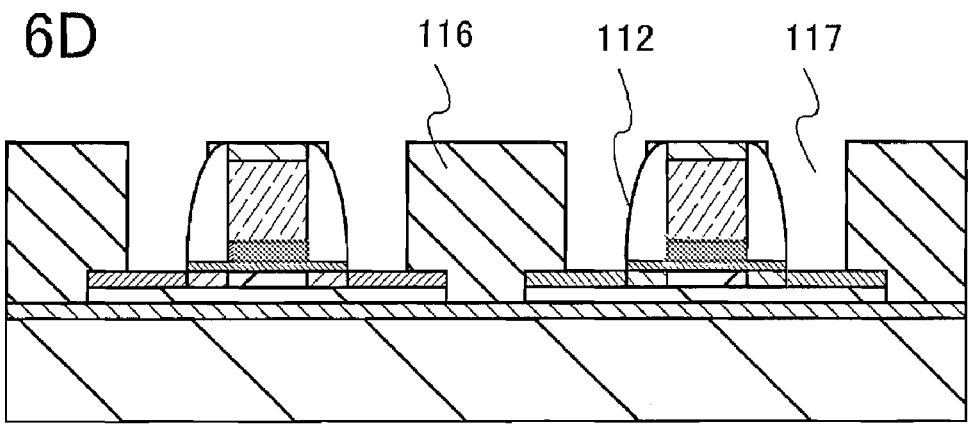

An interlayer insulating layer 116 is formed. The interlayer insulating layer 116 is formed by formation of a BPSG (boron phosphorus silicon glass) film or application of an organic resin typified by polyimide (FIG. 6D). Contact holes 117 are formed in the interlayer insulating layer 116. The contact holes 117 have a structure of self-aligned contact formed by utilizing the sidewall insulating layers 112. Of course, the contact holes 117 do not necessarily employ the self-aligned contact.

Then, a wiring 119 is formed in accordance with the contact holes 117. The wiring 119 is formed using aluminum or an aluminum alloy, and metal films of molybdenum, chromium, titanium, or the like are formed as barrier metals in an upper layer and a lower layer (FIG. 7).

In this manner, a field-effect transistor can be manufactured using the single-crystalline semiconductor layer 101 that is bonded to the supporting substrate 100. Because the single-crystalline semiconductor layer 101 according to this embodiment mode is a single-crystalline semiconductor with uniform crystal orientation, a homogeneous, high-performance field-effect transistor can be obtained. In other words, it is possible to suppress inhomogeneity of values of important transistor characteristics, such as threshold voltage and mobility, and to achieve high performance such as high mobility.

Figure 8:
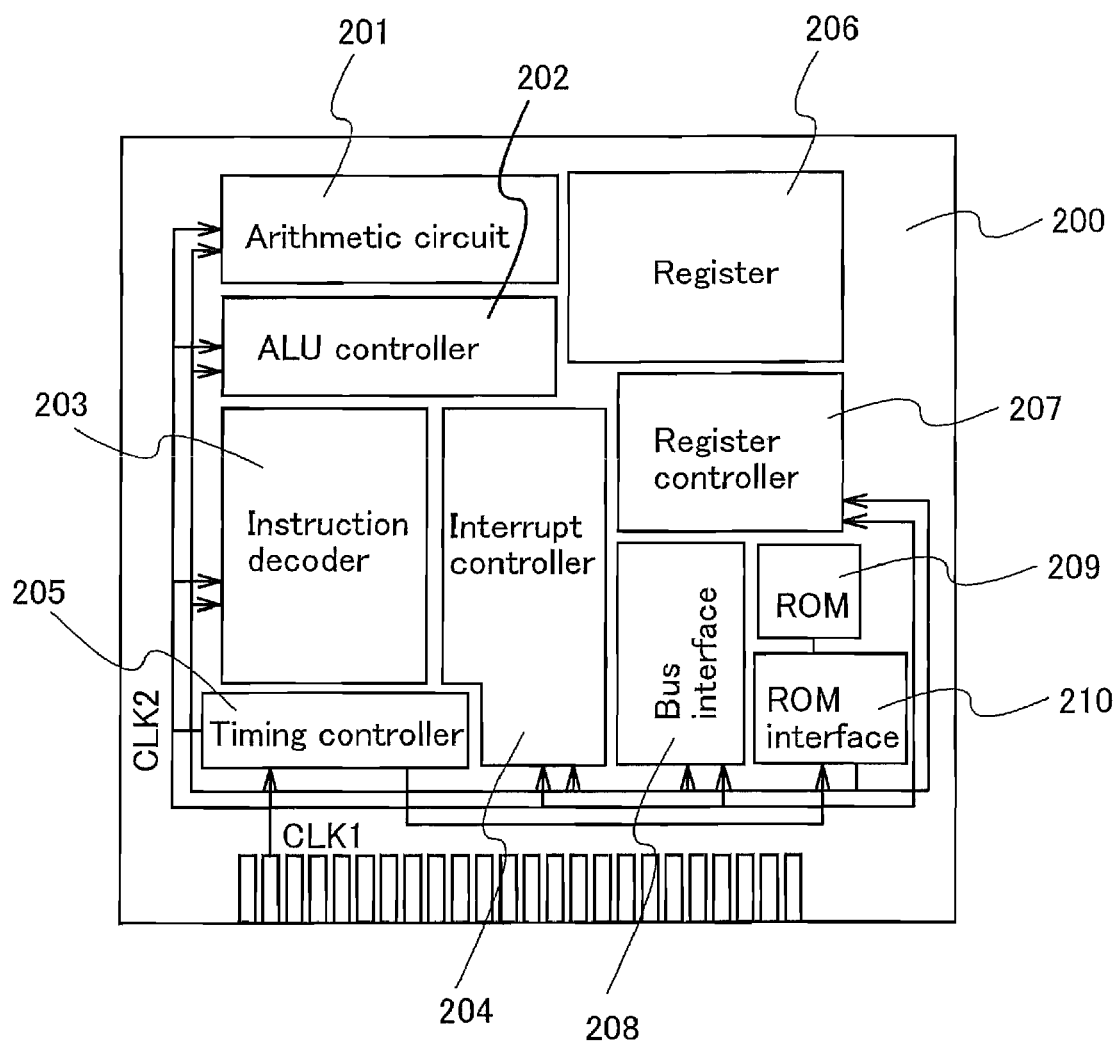
FIG. 8 is a block diagram of a structure of a microprocessor which is obtained using a substrate having an SOI structure.

FIG. 8 shows an example of a microprocessor 200 as an example of a semiconductor device. The microprocessor 200 is manufactured using the semiconductor substrate of this embodiment mode as described above. The microprocessor 200 includes an arithmetic logic unit (ALU) 201, an ALU controller 202, an instruction decoder 203, an interrupt controller 204, a timing controller 205, a register 206, a register controller 207, a bus interface (Bus I/F) 208, a read-only memory 209, and a ROM interface (ROM I/F) 210.

An instruction input to the microprocessor 200 through the bus interface 208 is input to the instruction decoder 203, decoded therein, and then input to the ALU controller 202, the interrupt controller 204, the register controller 207, and the timing controller 205. The ALU controller 202, the interrupt controller 204, the register controller 207, and the timing controller 205 conduct various controls based on the decoded instruction. Specifically, the ALU controller 202 generates signals for controlling the operation of the ALU 201. While the microprocessor 200 is executing a program, the interrupt controller 204 processes an interrupt request from an external input/output device or a peripheral circuit based on its priority or a mask state. The register controller 207 generates an address of the register 206, and reads and writes data from and to the register 206 in accordance with the state of the microprocessor 200. The timing controller 205 generates signals for controlling timing of operation of the ALU 201, the ALU controller 202, the instruction decoder 203, the interrupt controller 204, and the register controller 207. For example, the timing controller 205 is provided with an internal clock generator for generating an internal clock signal CLK2 based on a reference clock signal CLK1, and supplies the clock signal CLK2 to the various above-mentioned circuits. Note that the microprocessor 200 shown in FIG. 8 is only an example in which the configuration is simplified, and an actual microprocessor may have various configurations depending on the uses.

The microprocessor 200 can achieve not only increase in processing speed but also reduction in power consumption because an integrated circuit is formed using a single-crystalline semiconductor layer with uniform crystal orientation which is bonded over a supporting substrate having an insulating surface.

Figure 9:
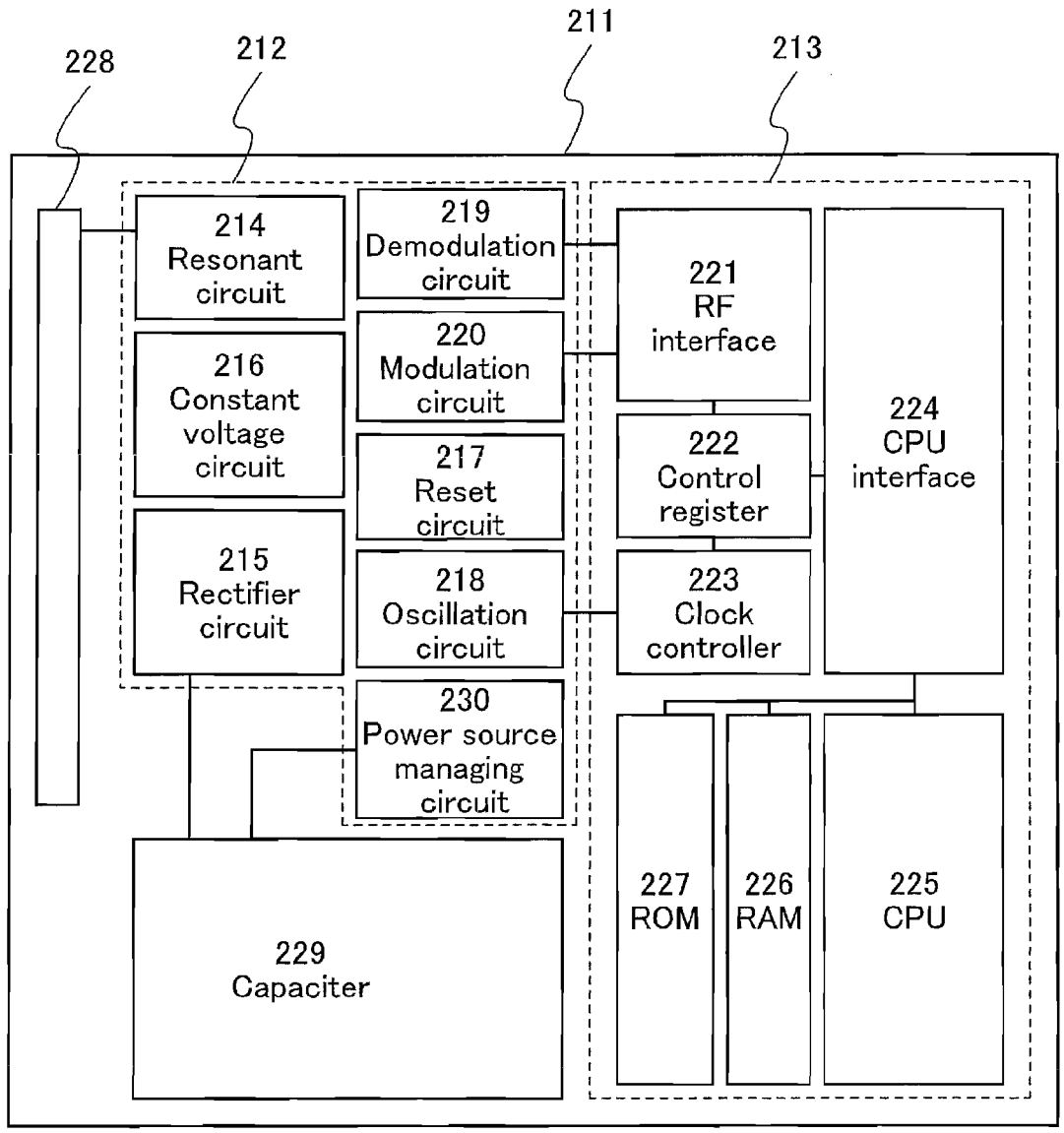
FIG. 9 is a block diagram of a structure of an RFCPU which is obtained using a substrate having an SOI structure.

Next, an example of a semiconductor device having an arithmetic function that can transmit and receive data without contact is described with reference to FIG. 9. FIG. 9 shows an example of a computer that operates to transmit and receive signals to and from an external device by wireless communication (such a computer is hereinafter referred to as an "RFCPU"). An RFCPU 211 includes an analog circuit portion 212 and a digital circuit portion 213. The analog circuit portion 212 includes a resonance circuit 214 with a resonance capacitor, a rectifier circuit 215, a constant voltage circuit 216, a reset circuit 217, an oscillation circuit 218, a demodulation circuit 219, and a modulation circuit 220. The digital circuit portion 213 includes an RF interface 221, a control register 222, a clock controller 223, an interface 224, a central processing unit 225, a random-access memory 226, and a read-only memory 227.

The operation of the RFCPU 211 having such a configuration is as follows. The resonance circuit 214 generates an induced electromotive force based on a signal received by an antenna 228. The induced electromotive force is stored in a capacitor portion 229 through the rectifier circuit 215. This capacitor portion 229 is preferably formed using a capacitor such as a ceramic capacitor or an electric double layer capacitor. The capacitor portion 229 does not need to be integrated with the RFCPU 211 and it is acceptable as long as the capacitor portion 229 is mounted as a different component on a substrate having an insulating surface which is included in the RFCPU 211.

The reset circuit 217 generates a signal that resets the digital circuit portion 213 to be initialized. For example, the reset circuit 217 generates, as a reset signal, a signal that rises with delay after increase in the power supply voltage. The oscillation circuit 218 changes the frequency and the duty ratio of a clock signal in accordance with a control signal generated by the constant voltage circuit 216. The demodulation circuit 219 having a low pass filter, for example, binarizes amplitude fluctuation of reception signals of an amplitude shift keying (ASK) system. The modulation circuit 220 transmits transmission data by changing the amplitude of transmission signals of an amplitude shift keying (ASK) system. The modulation circuit 220 changes the resonance point of the resonance circuit 214, thereby changing the amplitude of communication signals. The clock controller 223 generates a control signal for changing the frequency and the duty ratio of the clock signal in accordance with the power supply voltage or current consumption in the central processing unit 225. The power supply voltage is monitored by a power supply control circuit 230.

A signal input from the antenna 228 to the RFCPU 211 is demodulated by the demodulation circuit 219 and then decomposed into a control command, data, and the like by the RF interface 221. The control command is stored in the control register 222. The control command includes reading of data stored in the read-only memory 227, writing of data to the random-access memory 226, an arithmetic instruction to the central processing unit 225, and the like. The central processing unit 225 accesses the read-only memory 227, the random-access memory 226, and the control register 222 via the interface 224. The interface 224 has a function of generating an access signal for any of the read-only memory 227, the random-access memory 226, and the control register 222 based on an address the central processing unit 225 requests.

As an arithmetic method of the central processing unit 225, a method may be employed in which the read-only memory 227 stores an operating system (OS) and a program is read and executed at the time of starting operation. Alternatively, a method may be employed in which a circuit dedicated to arithmetic is formed as an arithmetic circuit and arithmetic processing is conducted using hardware. In a method in which both hardware and software are used, part of processing can be conducted by a circuit dedicated to arithmetic and the other part of the arithmetic processing can be conducted by the central processing unit 225 using a program.

The RFCPU 211 can achieve not only increase in processing speed but also reduction in power consumption because an integrated circuit is formed using a single-crystalline semiconductor layer with uniform crystal orientation which is bonded over a substrate having an insulating surface or an insulating substrate. This makes it possible to ensure the operation for a long period even when the capacitor portion 229 which supplies power is downsized. Although FIG. 9 shows a mode of the RFCPU, the semiconductor device may be an IC tag or the like as long as it has a communication function, an arithmetic processing function, and a memory function.

Figure 10:
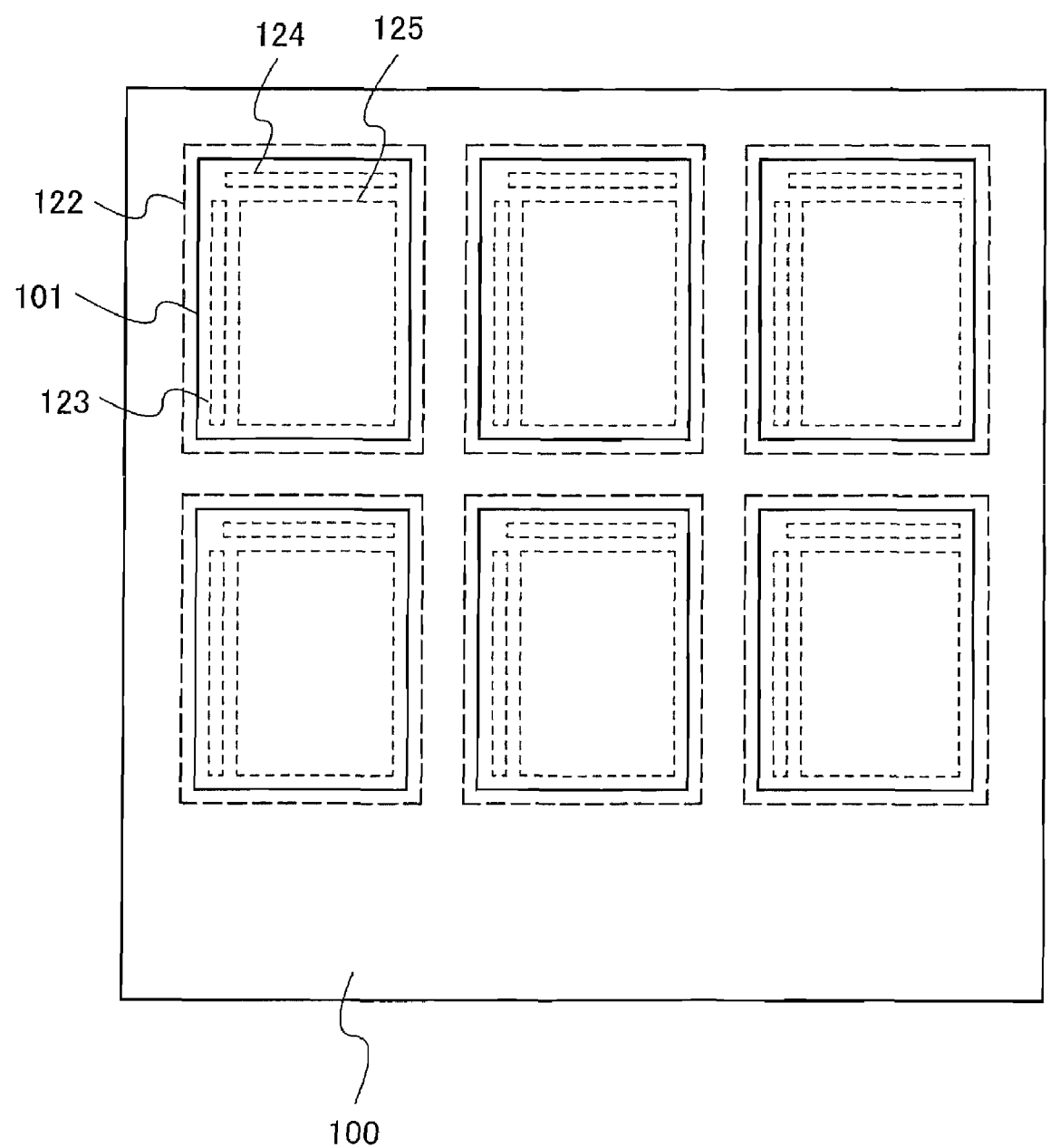
FIG. 10 is a plane view showing an example in the case of bonding single-crystalline semiconductor layers to a mother glass for manufacturing a display panel.

The single-crystalline semiconductor layer 101 exemplified in FIGS. 1A to 2B can be bonded to a large glass substrate called a mother glass with which a display panel can be manufactured. FIG. 10 shows the case where the single-crystalline semiconductor layer 101 is bonded to a mother glass that is used as the supporting substrate 100. A plurality of display panels are taken from a mother glass, and the single-crystalline semiconductor layers 101 are preferably bonded so as to match formation regions of display panels 122. Since a mother glass substrate has a larger area than a semiconductor substrate, it is preferable that the single-crystalline semiconductor layers 101 be arranged separately as shown in FIG. 10. The display panels 122 each includes a scanning line driver circuit region 123, a signal line driver circuit region 124, and a pixel formation region 125. The single-crystalline semiconductor layers 101 are bonded to the supporting substrate 100 (mother glass) so that these regions are included.

Figure 11A:
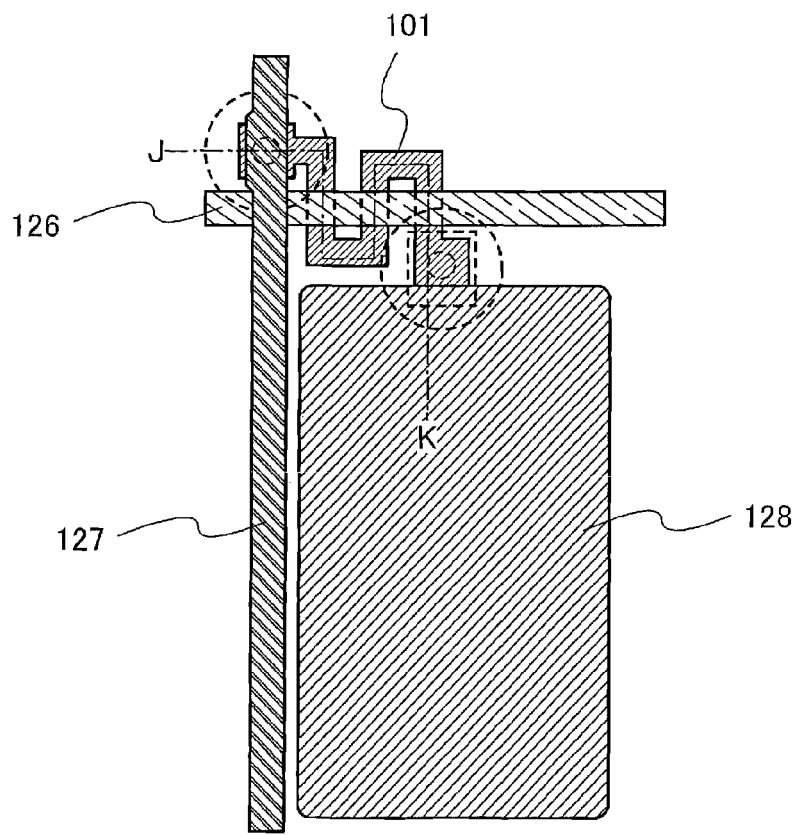
FIGS. 11A and 11B show an example of a liquid crystal display panel in which a pixel transistor is formed using a single-crystalline semiconductor layer.
Figure 11B:
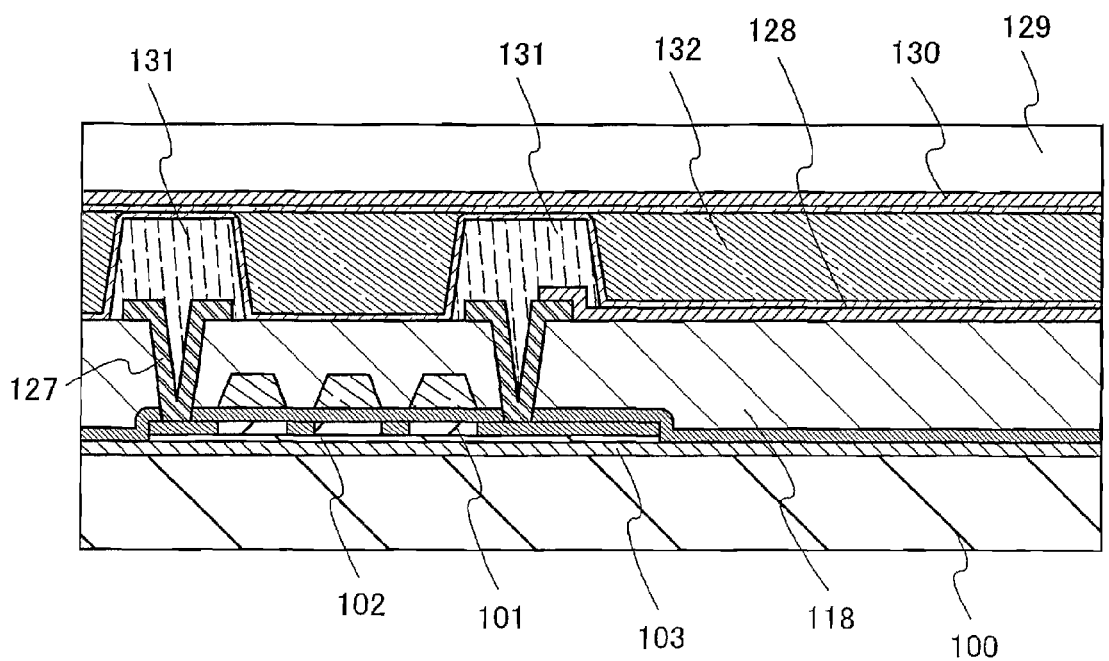

FIGS. 11A and 11B show an example of a pixel of a liquid crystal display panel in which a pixel transistor is formed using the single-crystalline semiconductor layer 101. FIG. 11A is a plane view of a pixel, in which a scanning line 126 intersects with the single-crystalline semiconductor layer 101 and the single-crystalline semiconductor layer 101 is connected to a signal line 127 and a pixel electrode 128. FIG. 11B is a cross-sectional view corresponding to a line J-K in FIG. 11A.

In FIG. 11B, a stack of a silicon nitride layer and a silicon oxide layer is formed as the barrier layer 103 over the supporting substrate 100. The single-crystalline semiconductor layer 101 is bonded to the barrier layer 103 with the use of the bonding layer 102. The pixel electrode 128 is provided over an insulating layer 118. By etching of the insulating layer 118, a step in the form of a depression is generated in a contact hole, by which the single-crystalline semiconductor layer 101 is connected to the signal line 127, and a columnar spacer 131 is provided so as to fill the step. A counter substrate 129 is provided with a counter electrode 130. A liquid crystal layer 132 is formed in a space which is formed by the columnar spacer 131.

Figure 12A:
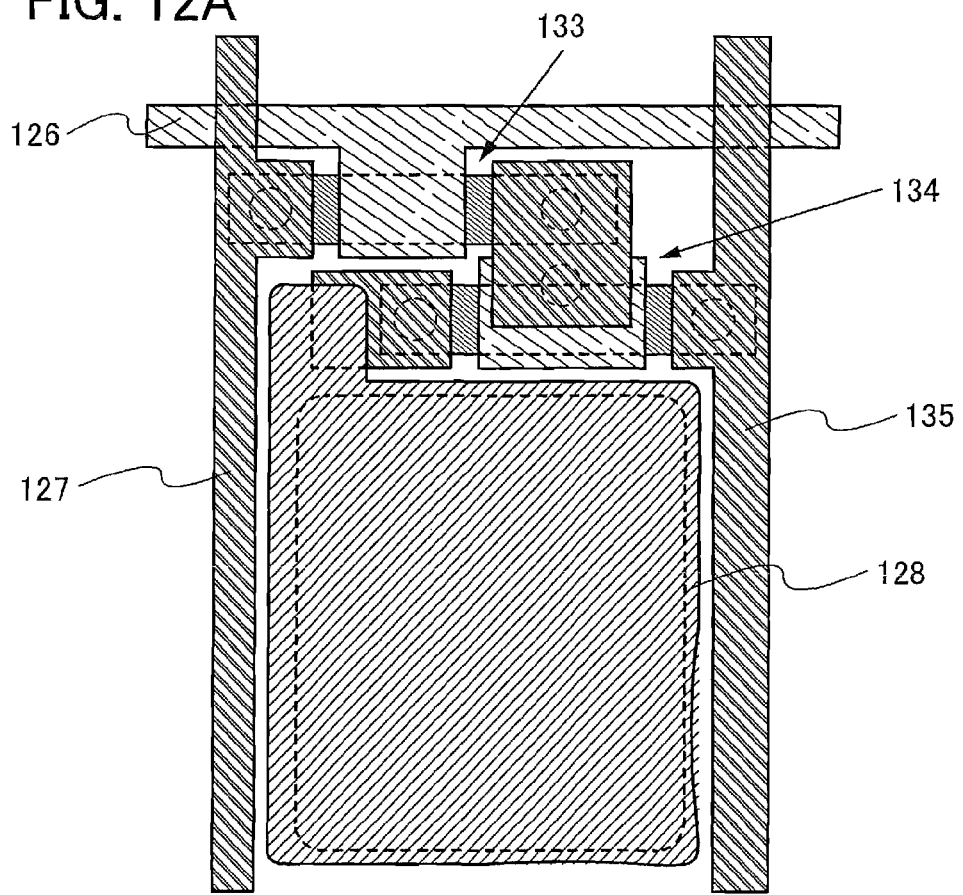
FIGS. 12A and 12B show an example of an electroluminescent display panel in which a pixel transistor is formed using a single-crystalline semiconductor layer.
Figure 12B:
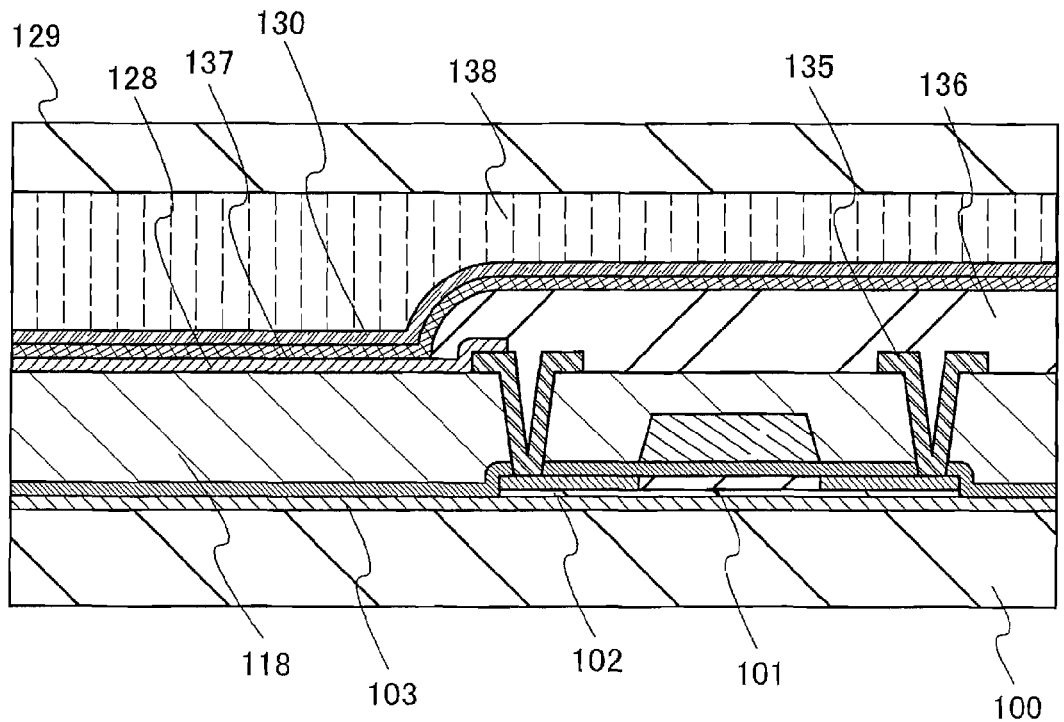

FIG. 12A shows an example of an electroluminescent display panel in which a transistor in a pixel portion is formed using the single-crystalline semiconductor layer 101. FIG. 12A is a plane view of the pixel, and a selection transistor 133 connected to the signal line 127 and a display control transistor 134 connected to a current supply line 135 are included. This display panel has a structure where a light-emitting element in which a layer (EL layer) formed including an electroluminescent material is sandwiched between electrodes is provided in each pixel. The pixel electrode 128 is connected to the display control transistor 134. FIG. 12B is a cross-sectional view showing a main section of the pixel.

In FIG. 12B, the structure of the supporting substrate 100, the barrier layer 103, the bonding layer 102, the single-crystalline semiconductor layer 101, the insulating layer 118, and the like is similar to that of FIG. 11B. The periphery of the pixel electrode 128 is surrounded by an insulating partition wall layer 136. An EL layer 137 is formed over the pixel electrode 128. The counter electrode 130 is formed over the EL layer 137. A pixel portion is filled with a filling resin 138, and the counter substrate 129 is provided as a reinforcing board.

The display screen of the electroluminescent display panel of this embodiment mode is formed by arranging such pixels in matrix. In this case, since channel portions of the transistors in the pixels are formed of the single-crystalline semiconductor layers 101, variation in characteristics between the transistors does not arise; accordingly, there is an advantage in that there is no variation in light emission luminance between pixels. Therefore, it is easier to drive a light-emitting element and control the luminance of the light-emitting element by current, and a correction circuit which corrects variation in transistor characteristics becomes unnecessary, which can reduce the load on the driving circuit.

As described above, a single-crystalline semiconductor layer can be formed even over a mother glass with which a display panel is manufactured to form a transistor. The transistor formed using a single-crystalline semiconductor layer is superior to an amorphous silicon transistor in all operating characteristics such as capacity of current drive; therefore, the transistor can be downsized. Accordingly, an aperture ratio of a pixel portion in the display panel can be improved. Further, since a microprocessor like the one illustrated in FIGS. 8 and 9 can be formed, a function as a computer can be provided in the display panel. Furthermore, a display in which data can be input and output without contact can be manufactured.

Embodiment 1

Embodiment 1 will describe a manufacturing method of a substrate having an SOI structure with reference to FIGS. 13A to 14B.

Figure 13A:
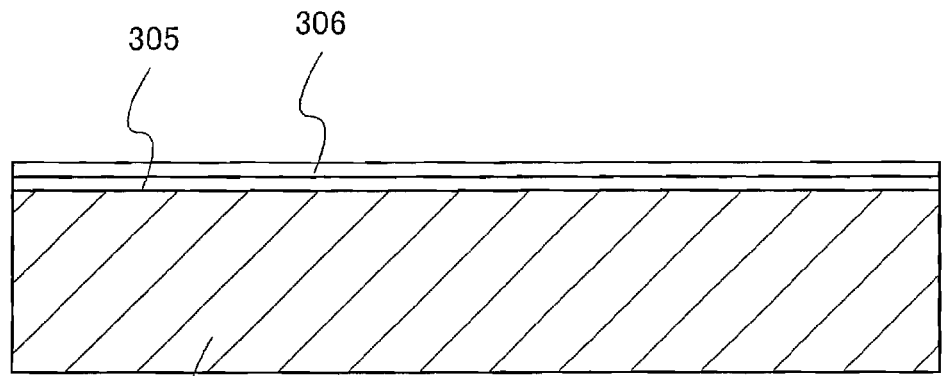
FIGS. 13A to 13C are cross-sectional views of a manufacturing method of a substrate having an SOI structure according to Embodiment 1.

First, a silicon oxynitride film 305 is formed with a thickness of 100 nm by a plasma CVD method using a $SiH_4$ gas and a $N_2O$ gas over a single-crystalline silicon substrate 301 from which a natural oxide film is removed. In addition, a silicon nitride oxide film 306 is formed with a thickness of 50 nm using a $SiH_4$ gas, a $N_2O$ gas, and a $NH_3$ gas (FIG. 13A).

Figure 13B:
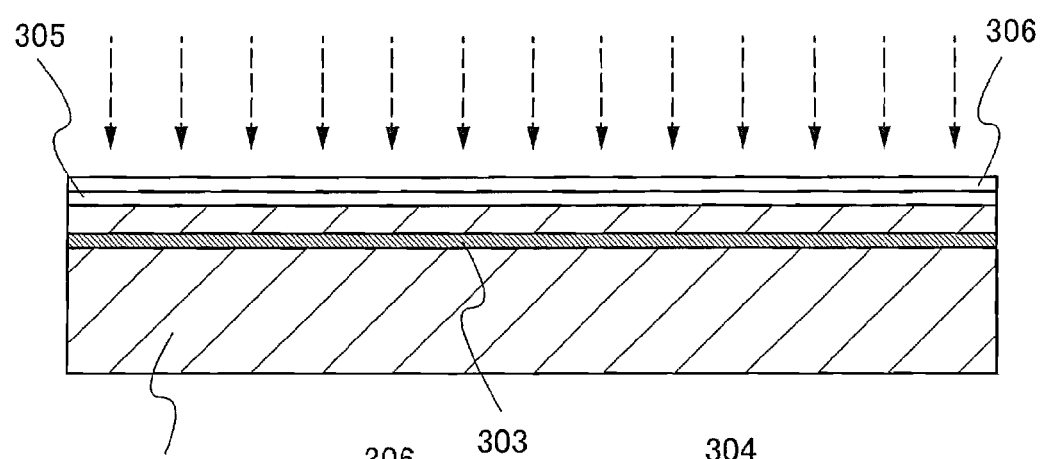

Then, hydrogen ions are introduced from a surface of the silicon nitride oxide film 306 with an ion doping apparatus (FIG. 13B). In this embodiment, hydrogen is ionized, and a separation layer 303 is formed in the single-crystalline silicon substrate 301. Ion doping is conducted with an accelerating voltage of 80 kV and a dose of $2 \times 10^{16}$ ions/cm$^2$.

The ion doping apparatus has a system in which an ionized gas is not mass-separated and directly accelerated by electric field to be introduced to a substrate. The ion doping apparatus includes a doping chamber which is connected to an ion source and has a structure in which the doping chamber is exhausted with a vacuum pump to have a reduced pressure and a substrate positioned in the doping chamber is irradiated with ions. The ion source includes a plasma chamber and an acceleration electrode system which withdraws ions produced in the plasma chamber. As a plasma generation method in the ion source, a DC filament method is preferably used. When the DC filament method is used, ions of plural kinds of the same type of atom which have different masses can be generated.

For example, in the case of performing ion doping by introducing a hydrogen gas, ion species of $H^+$, $H_2^+$, and $H_3^+$ can be generated. The ion species of $H^+$, $H_2^+$, and $H_3^+$ exist at proportions of 12%, 8%, and 80%, respectively, and the separation layer 303 is formed by introduction of the ion species to the single-crystalline silicon substrate 301. By letting higher-order ions having small masses contained in the separation layer 303 in this manner, cleavage of a single-crystalline silicon substrate 301 can be easily formed in a heat treatment process. In this case, by providing the silicon nitride oxide film 306 and the silicon oxynitride film 305 over a surface to be subjected to ion doping of the single-crystalline silicon substrate 301, surface roughness of the single-crystalline silicon substrate 301 due to ion doping can be prevented.

Figure 13C:
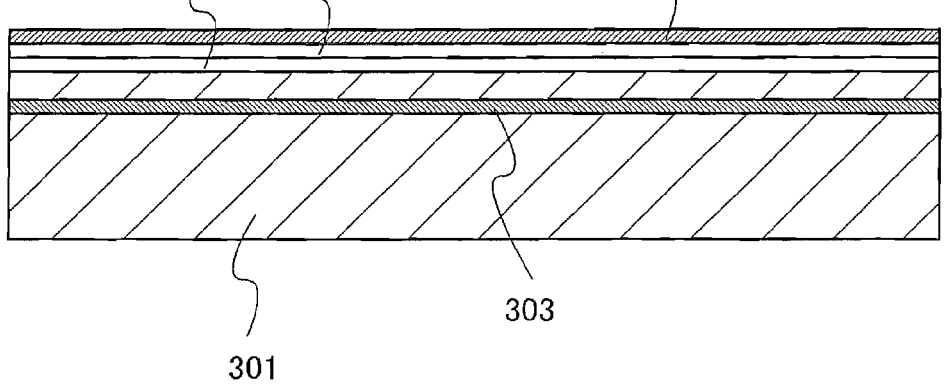

A silicon oxide film 304 is formed as a bonding layer over the silicon nitride oxide film 306 (FIG. 13C). The silicon oxide film 304 is formed with a thickness of 50 nm by a plasma CVD method using tetraethoxysilane (TEOS: chemical formula: $Si(OC_2H_5)_4$) and an oxygen gas. The film formation temperature is made at 350° C. or lower so that hydrogen is not disorbed from the separation layer 303.

Figure 14A:
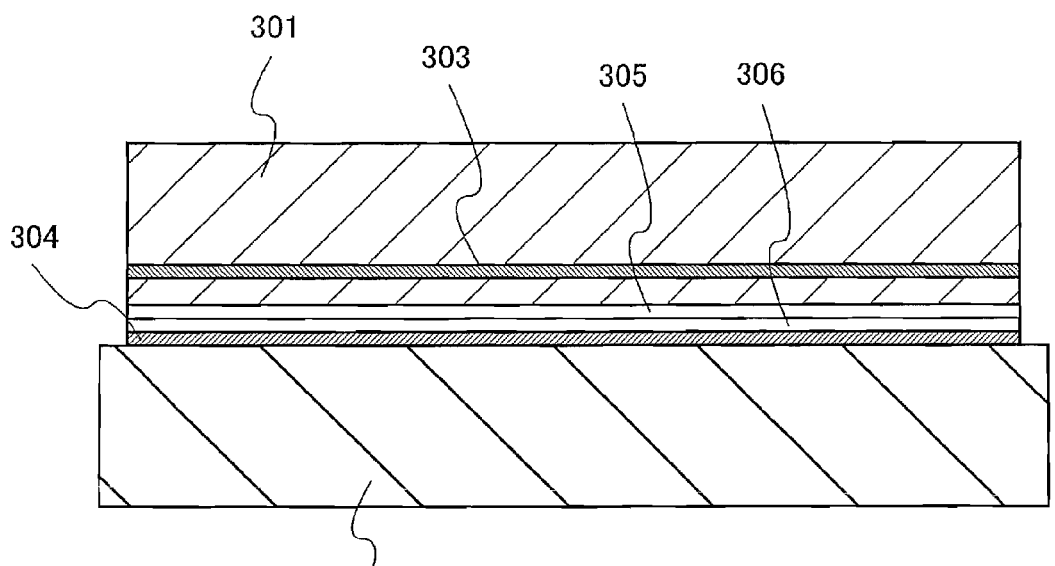
FIGS. 14A and 14B are cross-sectional views of a manufacturing method of a substrate having an SOI structure according to Embodiment 1.
Figure 14B:
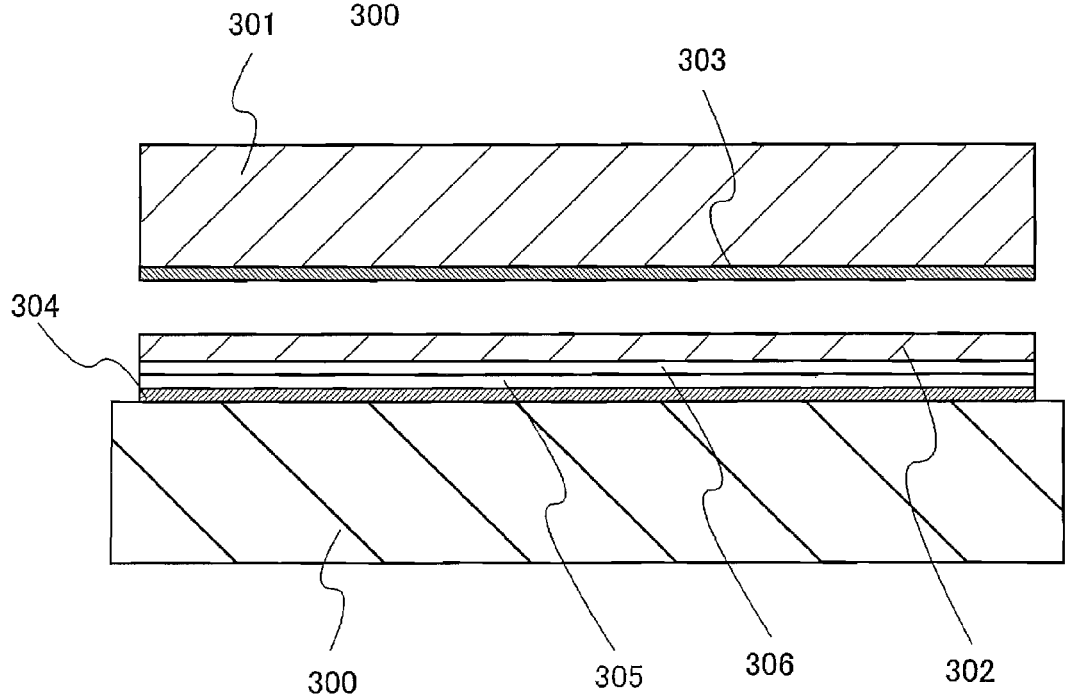

A glass substrate 300 subjected to ultrasonic cleaning and cleaning with ozone-containing water and the single-crystalline silicon substrate 301 are superposed on each other and pressed, with the silicon oxide film 304 interposed therebetween, so that a bond is formed (FIG. 14A). After that, first heat treatment is conducted to separate the single-crystalline silicon substrate 301 and the glass substrate 300 that is a supporting substrate from each other (FIG. 14B). Then, second heat treatment is conducted in a state that a single-crystalline semiconductor layer 302 is bonded to the glass substrate 300.

In this embodiment, the first heat treatment was conducted for two cases where the heat treatment temperatures were 410° C. and 500° C. The heat treatment time for each case was two hours. Note that for each case of the heat treatment, preheating at 410° C. for 10 minutes was conducted before heating at the predetermined temperature, and slow cooling was conducted at 410° C. for 2 hours after each case of the heat treatment. In addition, the second heat treatment was conducted at 550° C. for 2 hours. For the second heat treatment, time for preheating and slow cooling is provided before and after the heat treatment, similarly to the first heat treatment.

Figure 15:
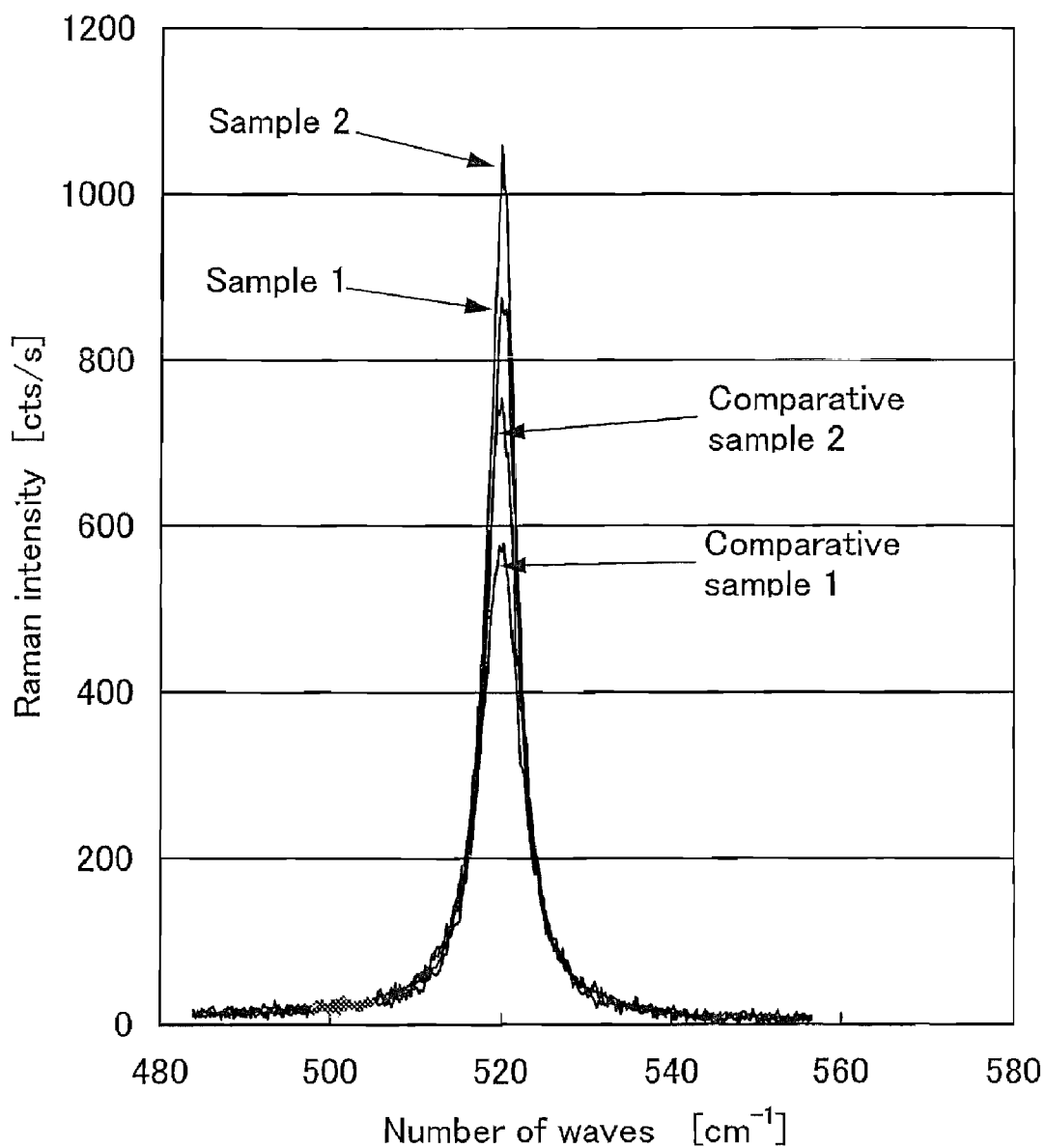
FIG. 15 is a graph showing Raman spectra of single-crystalline semiconductor layers of substrates each having an SOI structure according to Embodiment 1.

Table 1 shows the evaluation results of Raman spectroscopic characteristics for single-crystalline semiconductor layers provided over glass substrates, to each of which the first heat treatment and the second heat treatment are conducted. FIG. 15 shows Raman spectroscopic spectra. The evaluation of the Raman spectroscopic characteristics was carried out with a laser Raman spectrometer (HORIBA U1000).

TABLE 1

|  | Sample 1 | Sample 2 | Bulk Si |
| --- | --- | --- | --- |
| First heat treatment temperature | 410° C. | 500° C. | — |
| Second heat treatment temperature | 550° C. | 550° C. | — |
| Raman shift [cm$^{-1}$] | 520.2 | 520.1 | 520.7 |
| Raman intensity [cts/s] | 905 | 1031 | 4384 |
| Full width at half maximum [cm$^{-1}$] | 4.10 | 3.95 | 2.77 |

As a comparative example, samples were manufactured with the same condition of the first heat treatment and without the second heat treatment, and the Raman spectroscopic characteristics of the samples were evaluated similarly. The results are shown in Table 2.

TABLE 2

|  | Comparative sample A | Comparative sample B |
| --- | --- | --- |
| First heat treatment temperature | 410° C. | 500° C. |
| Second heat treatment temperature | — | — |
| Raman shift [cm$^{-1}$] | 520.0 | 520.0 |
| Raman intensity [cts/s] | 582 | 747 |
| Full width at half maximum [cm$^{-1}$] | 5.59 | 4.77 |

When the samples of this embodiment and the samples of the comparative example are compared with reference to Tables 1 and 2 and FIG. 15, the full widths at half-maximum of the Raman spectra of the samples of this embodiment, to each of which the second heat treatment was conducted, are smaller. This shows that crystal defects and crystal distortion are reduced by the second heat treatment, thereby improving crystallinity. Further, the samples of this embodiment, to each of which the second heat treatment is conducted, have stronger Raman intensities. The Raman intensity is a comparative value, but the value tends to be higher as the crystallinity is higher. Therefore, it is apparent that the second heat treatment is effective for crystallinity recovery of a single-crystalline semiconductor layer bonded to a glass substrate.

As described above, according to this embodiment, the single-crystalline semiconductor layer 302 having relaxed distortion and superior crystallinity can be bonded to the glass substrate 300. Each of the single-crystalline semiconductor layers 302 manufactured in this embodiment is strongly bonded to the glass substrate 300 and is not separated therefrom even when a separation test using a tape is conducted. In other words, the single-crystalline semiconductor layer can be provided over a variety of glass substrates that are used in the electronics industry and that are called non-alkali glass substrates, such as aluminosilicate glass substrates, aluminoborosilicate glass substrates, and barium borosilicate glass substrates. Various integrated circuits and display devices can be manufactured using a substrate that is longer than one meter on each side.

This application is based on Japanese Patent Application serial no. 2007-112432 filed with Japan Patent Office on Apr. 20, 2007, the entire contents of which are hereby incorporated by reference.

What is claimed is:

1. A manufacturing method of an SOI substrate comprising the steps of:
    introducing ions into a portion of a semiconductor substrate to form a separation layer having a porous structure;
    forming a layer on a second substrate;
    bonding the semiconductor substrate and the second substrate with the layer interposed therebetween;
    performing a first heat treatment by which the semiconductor substrate is cleaved at the separation layer so that a part of the semiconductor substrate remains as a semiconductor layer over the second substrate; and
    performing a second heat treatment to the second substrate to which the semiconductor layer is bonded,
    wherein a temperature of the second heat treatment is equal to or higher than that of the first heat treatment;
    wherein the temperature of the first heat treatment is equal to or higher than 400° C. and lower than 600° C.; and
    wherein the temperature of the second heat treatment is equal to or lower than a strain point of the second substrate.

2. The manufacturing method of an SOI substrate according to claim 1, further comprising forming a silicon oxide layer over the semiconductor substrate prior to the step of introducing ions into the portion of the semiconductor substrate.

3. The manufacturing method of an SOI substrate according to claim 2, further comprising removing of the silicon oxide layer after the step of introducing ions into the portion of the semiconductor substrate.

4. The manufacturing method of an SOI substrate according to claim 1, wherein the ions are $H^+$, $H_2^+$, and $H_3^+$ ions.

5. The manufacturing method of an SOI substrate according to claim 4, wherein a proportion of the $H_3^+$ ions is made higher than those of the other ions among the ions.

6. The manufacturing method of an SOI substrate according to claim 1,
    wherein a treatment time of the second heat treatment is longer than that of the first heat treatment.

7. The manufacturing method of an SOI substrate according to claim 1,
    wherein the layer is a single layer of a film or a stacked layer of a plurality of films, the film or the films of the plurality of films being selected from the group consisting of a silicon oxide film, a silicon nitride film, a silicon nitride oxide film, and a silicon oxynitride film.

8. The SOI substrate according to claim 1, wherein the second substrate is a glass substrate.

9. The manufacturing method of an SOI substrate according to claim 2, wherein the silicon oxide layer is formed by any method of the group comprising thermal oxidation, soaking in an oxidizing chemical solution and plasma CVD deposition.

10. A manufacturing method of an SOI substrate comprising the steps of:
introducing ions of plural kinds of the same type of atom which have different masses into a portion of a semiconductor substrate to form a separation layer having a porous structure in the semiconductor substrate;
forming a layer on a second substrate;
bonding the semiconductor substrate and the second substrate with the layer interposed therebetween;
performing a first heat treatment by which the semiconductor substrate is separated at the separation layer so that a part of the semiconductor substrate remains as a semiconductor layer, over the second substrate; and
performing a second heat treatment to the second substrate to which the semiconductor layer is bonded,
wherein a temperature of the second heat treatment is equal to or higher than that of the first heat treatment;
wherein the temperature of the first heat treatment is equal to or higher than 400° C. and lower than 600° C.; and
wherein the temperature of the second heat treatment is equal to or lower than a strain point of the second substrate.

11. The manufacturing method of an SOI substrate according to claim 10, further comprising forming a silicon oxide layer over the semiconductor substrate prior to the step of introducing ions into the portion of the semiconductor substrate.

12. The manufacturing method of an SOI substrate according to claim 11, further comprising removing of the silicon oxide layer after the step of introducing ions into the portion of the semiconductor substrate.

13. The manufacturing method of an SOI substrate according to claim 10,
wherein the ions of plural kinds of the same type of atom which have different masses are $H^+$, $H_2^+$, and $H_3^+$ ions.

14. The manufacturing method of an SOI substrate according to claim 13,
wherein a proportion of the $H_3^+$ ions is made higher than those of the other ions among the ions.

15. The manufacturing method of an SOI substrate according to claim 10,
wherein a treatment time of the second heat treatment is longer than that of the first heat treatment.

16. The manufacturing method of an SOI substrate according to claim 10,
wherein the layer is a single layer of a film or a stacked layer of a plurality of films, the film or the films of the plurality of films being selected from the group consisting of a silicon oxide film, a silicon nitride film, a silicon nitride oxide film, and a silicon oxynitride film.

17. The SOI substrate according to claim 10, wherein the second substrate is a glass substrate.

18. The manufacturing method of an Sal substrate according to claim 11, wherein the silicon oxide layer is formed by any method of the group comprising thermal oxidation, soaking in an oxidizing chemical solution and plasma CVD deposition.

19. A manufacturing method of an SOI substrate comprising the steps of:
introducing ions comprising an $H_3^+$ ion into a portion of a semiconductor substrate to form a separation layer having a porous structure in the semiconductor substrate;
forming a layer on a second substrate;
bonding the semiconductor substrate and the second substrate with the layer interposed therebetween;
performing a first heat treatment by which the semiconductor substrate is separated at the separation layer so that a part of the semiconductor substrate remains as a semiconductor layer, over the second substrate; and
performing a second heat treatment to the second substrate to which the semiconductor layer is bonded,
wherein a temperature of the second heat treatment is equal to or higher than that of the first heat treatment;
wherein the temperature of the first heat treatment is equal to or higher than 400° C. and lower than 600° C., and
wherein the temperature of the second heat treatment is equal to or lower than a strain point of the second substrate.

20. The manufacturing method of an SOI substrate according to claim 19, further comprising forming a silicon oxide layer over the semiconductor substrate prior to the step of introducing ions into the portion of the semiconductor substrate.

21. The manufacturing method of an SOI substrate according to claim 20, further comprising removing the silicon oxide layer after the step of introducing ions into the portion of the semiconductor substrate.

22. The manufacturing method of an SOI substrate according to claim 19,
wherein the ions further comprising $H^+$ and $H_2^+$ ions, and
wherein a proportion of the $H_3^+$ ions is made higher than those of the other ions among the ions.

23. The manufacturing method of an SOI substrate according to claim 19,
wherein a treatment time of the second heat treatment is longer than that of the first heat treatment.

24. The manufacturing method of an SOI substrate according to claim 19,
wherein the layer is a single layer of a film or a stacked layer of a plurality of films, the film or the films of the plurality of films being selected from the group consisting of a silicon oxide film, a silicon nitride film, a silicon nitride oxide film, and a silicon oxynitride film.

25. The SOI substrate according to claim 19, wherein the second substrate is a glass substrate.

26. The manufacturing method of an SOI substrate according to claim 20, wherein the silicon oxide layer is formed by any method of the group comprising thermal oxidation, soaking in an oxidizing chemical solution and plasma CVD deposition.

* * * * *